(12) United States Patent
Chonan

(10) Patent No.: US 9,753,378 B2
(45) Date of Patent: *Sep. 5, 2017

(54) EXPOSURE APPARATUS, EXPOSURE METHOD, AND DEVICE MANUFACTURING METHOD

(71) Applicant: NIKON CORPORATION, Tokyo (JP)

(72) Inventor: Junichi Chonan, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 26 days.

This patent is subject to a terminal disclaimer.

(21) Appl. No.: 14/719,937

(22) Filed: May 22, 2015

(65) Prior Publication Data

US 2015/0253678 A1  Sep. 10, 2015

Related U.S. Application Data

(60) Division of application No. 13/228,032, filed on Sep. 8, 2011, now Pat. No. 9,041,902, which is a continuation of application No. PCT/JP2010/001695, filed on Mar. 10, 2010.

(60) Provisional application No. 61/202,533, filed on Mar. 10, 2009.

(51) Int. Cl.
   *G03F 7/20* (2006.01)
(52) U.S. Cl.
   CPC ................ *G03F 7/70341* (2013.01)
(58) Field of Classification Search
   CPC ............... G03F 7/2041; G03F 7/70341; G03F 7/70858; G03F 7/70866; G03F 7/70883; G03F 7/70925; G03F 7/70933

USPC ............... 355/30, 52, 53, 55, 67–71, 72, 77; 250/492.1, 492.2, 492.22, 548; 430/5, 22, 430/30, 311, 312, 321

See application file for complete search history.

(56) References Cited

U.S. PATENT DOCUMENTS

| | | |
|---|---|---|
| 6,208,407 B1 | 3/2001 | Loopstra |
| 6,262,796 B1 | 7/2001 | Loopstra et al. |
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |

(Continued)

FOREIGN PATENT DOCUMENTS

| | | |
|---|---|---|
| EP | 1 739 488 A1 | 1/2007 |
| EP | 1 876 635 A1 | 1/2008 |

(Continued)

OTHER PUBLICATIONS

Oct. 15, 2015 Office Action issued in Korean Patent Application No. 10-2011-7023415.

(Continued)

*Primary Examiner* — Christina Riddle
(74) *Attorney, Agent, or Firm* — Oliff PLC

(57) ABSTRACT

An exposure apparatus exposes a substrate with exposure light via a liquid. The exposure apparatus includes an optical system including an emission surface from which the exposure light is emitted; a liquid supply port that supplies the liquid in order to fill an optical path of the exposure light emitted from the emission surface with the liquid; and a fluid supply port that supplies a fluid including a material capable of changing the specific resistance of the liquid to at least a part of a space around a liquid immersion space that is formed by the liquid.

23 Claims, 10 Drawing Sheets

(56) References Cited

U.S. PATENT DOCUMENTS

| | | | |
|---|---|---|---|
| 6,897,963 | B1 | 5/2005 | Taniguchi et al. |
| 7,023,610 | B2 | 4/2006 | Ohtsuki et al. |
| 7,292,313 | B2 | 11/2007 | Poon et al. |
| 2005/0018155 | A1* | 1/2005 | Cox ................. G03F 7/709 355/30 |
| 2006/0001851 | A1 | 1/2006 | Grant et al. |
| 2006/0012765 | A1 | 1/2006 | Kameyama |
| 2006/0050257 | A1 | 3/2006 | Honda |
| 2006/0082748 | A1 | 4/2006 | Schmidt et al. |
| 2006/0164616 | A1 | 7/2006 | Okada |
| 2007/0004234 | A1 | 1/2007 | Goodwin et al. |
| 2007/0085034 | A1 | 4/2007 | Chang et al. |
| 2007/0085989 | A1* | 4/2007 | Nagahashi ........... G03B 27/42 355/53 |
| 2007/0085990 | A1 | 4/2007 | Chibana |
| 2007/0127006 | A1 | 6/2007 | Shibazaki |
| 2007/0139632 | A1* | 6/2007 | Shiraishi ............ G03F 7/2041 355/55 |
| 2007/0177125 | A1 | 8/2007 | Shibazaki |
| 2007/0242247 | A1 | 10/2007 | Shiraishi |
| 2008/0002169 | A1 | 1/2008 | Hasegawa et al. |
| 2008/0032234 | A1 | 2/2008 | Mizutani |
| 2008/0156356 | A1* | 7/2008 | Nagasaka ........... G03F 7/70341 134/115 R |
| 2009/0134488 | A1 | 5/2009 | Jansen et al. |
| 2011/0134401 | A1 | 6/2011 | Rops et al. |

FOREIGN PATENT DOCUMENTS

| | | | |
|---|---|---|---|
| EP | 1 895 571 A1 | 3/2008 | |
| JP | H10-340846 A | 12/1998 | |
| JP | 2005-183693 A | 7/2005 | |
| JP | 2005-183744 A | 7/2005 | |
| JP | 2006-019585 A | 1/2006 | |
| JP | 2006-024819 A | 1/2006 | |
| JP | 2007-013180 A | 1/2007 | |
| JP | WO 2007046523 A1 * | 4/2007 | ......... G03F 7/70341 |
| JP | 2007-165852 A | 6/2007 | |
| JP | 2008-504708 A | 2/2008 | |
| JP | 2008-530789 A | 8/2008 | |
| KR | 1020070122442 | 12/2007 | |
| WO | 01/35168 A1 | 5/2001 | |
| WO | 2004/019128 A2 | 3/2004 | |
| WO | 2006/003373 A2 | 1/2006 | |
| WO | 2006/084641 A2 | 8/2006 | |
| WO | 2006/115186 A1 | 11/2006 | |
| WO | 2006/137410 A1 | 12/2006 | |

OTHER PUBLICATIONS

Jun. 22, 2010 International Search Report issued in International Application No. PCT/JP2010/001695.
Jun. 22, 2010 Written Opinion issued in International Application No. PCT/JP2010/001695.
Jun. 18, 2013 Japanese Office Action issued in Application No. 2011-503713.
Sep. 16, 2014 Notice of Reasons for Rejection issued in Japanese Patent Application No. 2013-264412.
Feb. 26, 2014 Office Action issued in U.S. Appl. No. 13/228,032.
Aug. 6, 2015 Office Action issued in U.S. Appl. No. 13/228,032.
Jan. 23, 2015 Notice of Allowance issued in U.S. Appl. No. 13/228,032.
Aug. 6, 2014 Office Action issued in U.S. Appl. No. 13/228,032.
Aug. 23, 2016 Office Action issued in Korean Patent Application No. 2011-7023415.

* cited by examiner

EXPOSURE APPARATUS, EXPOSURE METHOD, AND DEVICE MANUFACTURING METHOD

CROSS-REFERENCE TO RELATED APPLICATION

This is a Divisional application of U.S. application Ser. No. 13/228,032, filed Sep. 8, 2011, which is a Continuation application of International Application No. PCT/JP2010/001695, filed on Mar. 10, 2010, which claims priority to U.S. provisional application No. 61/202,533, filed Mar. 10, 2009, the contents of which are incorporated herein by reference.

BACKGROUND

Field of the Invention

The present invention relates to an exposure apparatus, an exposure method, and a device manufacturing method.

Description of Related Art

In exposure apparatuses used in photolithography processes, a liquid immersion exposure apparatus that exposes a substrate with exposure light via a liquid, as disclosed in Patent Document (Specification of US Patent Application Publication No. 2007/0139632), for example, is known.

In the liquid immersion exposure apparatus, there is a possibility that liquid filling the optical path of exposure light is charged. Moreover, there is also a possibility that a member contacting the liquid is also charged. Due to the charging, there is a possibility that foreign materials may be adsorbed to at least one of the liquid and the member. As a result, there is a possibility that exposure defects may occur, so that defective devices are produced.

SUMMARY

An object of aspects of the present invention is to provide an exposure apparatus and an exposure method capable of suppressing the occurrence of exposure defects resulting from charging of liquid or the like. Another object of aspects of the present invention is to provide a device manufacturing method capable of suppressing the occurrence of defective devices.

According to a first aspect of the present invention, there is provided an exposure apparatus that exposes a substrate with exposure light via a liquid, including: an optical system including an emission surface from which the exposure light is emitted; a liquid supply port that supplies the liquid in order to fill an optical path of the exposure light emitted from the emission surface with the liquid; and a fluid supply port that supplies a fluid including a material capable of changing the specific resistance of the liquid to at least a part of a space around a liquid immersion space that is formed by the liquid.

According to a second aspect of the present invention, there is provided an exposure apparatus that exposes a substrate with exposure light, including: an optical system including an emission surface from which the exposure light is emitted; a first supply port that supplies a first liquid in order to fill an optical path of the exposure light emitted from the emission surface with the first liquid having a first specific resistance; and a second supply port that supplies a second liquid having a lower specific resistance than the first liquid to at least a part of a space around a liquid immersion space that is formed by the first liquid.

According to a third aspect of the present invention, there is provided an exposure apparatus that exposes a substrate with exposure light via a liquid, including: an optical system including an emission surface from which the exposure light is emitted; a liquid supply port that supplies the liquid in order to fill an optical path of the exposure light emitted from the emission surface with the liquid; a fluid supply port that supplies a fluid including a material capable of changing the specific resistance of the liquid; and a fluid recovery port that recovers at least some of the fluid from at least a part of a space around a liquid immersion space that is formed by the liquid.

According to a fourth aspect of the present invention, there is provided a device manufacturing method including: exposing a substrate using the exposure apparatus according to any one of the first, second, and third aspects; and developing the exposed substrate.

According to a fifth aspect of the present invention, there is provided an exposure method including: filling an optical path of exposure light between an emission surface of an optical system and a substrate with a liquid; supplying a liquid including a material capable of changing the specific resistance of the liquid to at least a part of a space around a liquid immersion space of the liquid, formed on the substrate; and exposing the substrate with the exposure light via the liquid between the emission surface and the substrate.

According to a sixth aspect of the present invention, there is provided an exposure method including: filling an optical path of exposure light between an emission surface of an optical system and a substrate with a first liquid; supplying a second liquid having a lower specific resistance than the first liquid to at least a part of a space around a liquid immersion space of the first liquid, formed on the substrate; and exposing the substrate with the exposure light via the first liquid between the emission surface and the substrate.

According to a seventh aspect of the present invention, there is provided an exposure method including: filling an optical path of exposure light between an emission surface of an optical system and a substrate with a liquid; supplying a fluid including a material capable of changing the specific resistance of the liquid; recovering at least some of the fluid from at least a part of a space around a liquid immersion space of the liquid, formed on the substrate; and exposing the substrate with the exposure light via the liquid between the emission surface and the substrate.

According to an eighth aspect of the present invention, there is provided a device manufacturing method including: exposing a substrate using the exposure apparatus according to any one of the fifth, sixth, and seventh aspects; and developing the exposed substrate.

According to the aspects of the present invention, it is possible to suppress the occurrence of exposure defects. Moreover, according to the present invention, it is possible to suppress the occurrence of defective devices.

DESCRIPTION OF EMBODIMENTS

Hereinafter, embodiments of the present invention will be described with reference to the drawings. However, the present invention is not limited to these embodiments. In the following description, an XYZ orthogonal coordinate system is set, and the positional relationship between respective constituent elements will be described with reference to the XYZ orthogonal coordinate system. A predetermined direction within a horizontal plane is defined as the X-axis direction, a direction orthogonal to the X-axis direction is defined as the Y-axis direction, and a direction (that is, a vertical direction) orthogonal to the X and Y-axis directions is defined as the Z-axis direction. Moreover, the directions of rotation (inclination) about the X, Y, and Z axes are defined as the θX, θY, and θZ directions.

First Embodiment

Figure 1:
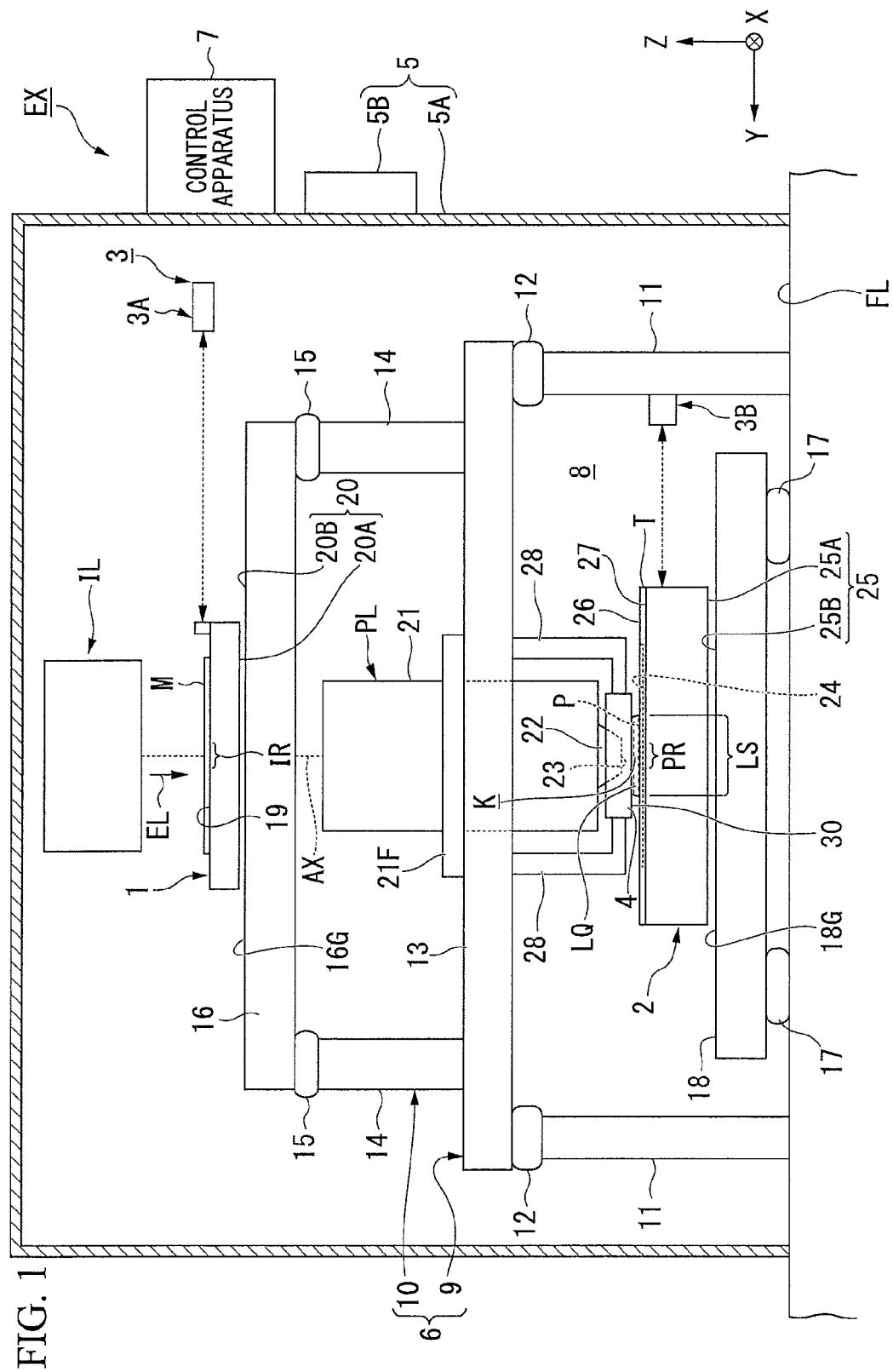
FIG. 1 is a schematic configuration diagram showing an example of an exposure apparatus according to a first embodiment.

The first embodiment will be described. FIG. 1 is a schematic configuration view showing an example of an exposure apparatus EX according to the first embodiment. The exposure apparatus EX of the present embodiment is a liquid immersion exposure apparatus that exposes a substrate P with exposure light EL via a liquid LQ. In the present embodiment, a liquid immersion space LS is formed so that at least a part of the optical path of the exposure light EL is filled with the liquid LQ. The liquid immersion space LS is a portion (space or region) filled with the liquid LQ. The substrate P is exposed with the exposure light EL via the liquid LQ in the liquid immersion space LS. In the present embodiment, water (pure water) is used as the liquid LQ.

In FIG. 1, the exposure apparatus EX includes a mask stage 1 configured to be movable while holding a mask M, a substrate stage 2 configured to be movable while holding the substrate P, an interferometer system 3 that optically measures the positions of the mask stage 1 and the substrate stage 2, an illumination system IL that illuminates the mask M with the exposure light EL, a projection optical system PL that projects the image of the pattern on the mask M illuminated with the exposure light EL onto the substrate P, a liquid immersion member 4 capable of forming the liquid immersion space LS so that at least a part of the optical path of the exposure light EL is filled with the liquid LQ, a chamber device 5 that accommodates at least the projection optical system PL and the substrate stage 2, a body 6 that supports at least the projection optical system PL, and a control device 7 that controls the overall operation of the exposure apparatus EX.

The mask M includes a reticle on which a device pattern projected onto the substrate P is formed. The mask M includes a transmissive mask which includes a transparent plate such as, for example, a glass plate, and a pattern formed on the transparent plate using a light shielding material such as chromium. A reflective mask may be used as the mask M.

The substrate P is a substrate used for manufacturing devices. The substrate P includes a base such as, for example, a semiconductor wafer, and a multi-layer film formed on the base. The multi-layer film is a film in which a plurality of films including at least a photosensitive film is laminated. The photosensitive film is a film formed of a photosensitive material. Moreover, the multi-layer film may include an anti-reflection film and a protective film (top-coat film) for protecting the photosensitive film, for example.

The chamber device 5 includes a chamber member 5A that forms a substantially closed inner space 8 and an environment control device 5B that controls the environment (temperature, humidity, cleanness, pressure, and the like) of the inner space 8. The substrate stage 2 moves inside the inner space 8. The control device 7 controls the environment of a space (the inner space 8), in which exposure of at least the substrate P held on the substrate stage 2 is performed, using the environment control device 5A.

In the present embodiment, the body 6 is disposed in the inner space 8. The body 6 includes a first column 9 formed on a supporting surface FL and a second column 10 formed on the first column 9. The first column 9 includes a first supporting member 11 and a first surface plate 13 that is supported on the first supporting member 11 with an anti-vibration device 12 disposed therebetween. The second column 10 includes a second supporting member 14 that is provided on the first surface plate 13 and a second surface plate 16 that is supported on the second supporting member 14 with an anti-vibration device 15 disposed therebetween. Moreover, in the present embodiment, a third surface plate 18 is disposed on the supporting surface FL with an anti-vibration device 17.

The illumination system IL irradiates a predetermined illumination region IR with the exposure light EL. The illumination region IR includes positions which can be irradiated with the exposure light EL emitted from the illumination system IL. The illumination system IL illuminates at least a part of the mask M disposed in the illumination region IR with the exposure light EL having a uniform illuminance distribution. As the exposure light EL emitted from the illumination system IL, deep ultraviolet light (DUV light) such as emission lines (g, h, and i-rays) emitted from a mercury lamp or a KrF excimer laser beam (wavelength: 248 nm), vacuum ultraviolet light (VUV light) such as an ArF excimer laser beam (wavelength: 193 nm) or an $F_2$ laser beam (wavelength: 157 nm), and the like are used, for example. In the present embodiment, the ArF excimer laser beam, which is ultraviolet light (vacuum ultraviolet light), is used as the exposure light EL.

The mask stage 1 includes a mask holder 19 that releasably holds the mask M, and is movable on a guide surface 16G of the second surface plate 16 in a state of holding the mask M. The mask stage 1 is movable relative to the illumination region IR while holding the mask M by the operation of a driving system 20. The driving system 20 includes a planar motor which includes a movable member 20A disposed on the mask stage 1 and a stationary member 20B disposed on the second surface plate 16. A planar motor capable of moving the mask stage 1 is disclosed in the specification of U.S. Pat. No. 6,452,292, for example. The mask stage 1 is movable in the six directions of the X, Y, and Z-axis directions and the θX, θY, and θZ directions by the operation of the driving system 20.

The projection optical system PL irradiates a predetermined projection region PR with the exposure light EL. The projection optical system PL projects the image of the pattern on the mask M onto at least a part of the substrate P disposed in the projection region PR at a predetermined projection magnification. The projection optical system PL of the present embodiment is a reduction system with a projection magnification, for example, of ¼, ⅕, ⅛, or the like. The projection optical system PL may be either a unity-magnification system or a magnification system. In the present embodiment, the optical axis AX of the projection optical system PL is parallel to the Z axis. Moreover, the projection optical system PL may be any one of a refracting system which does not include a reflective optical element, a reflecting system which does not include a refractive optical element, and a catadioptric system which includes a reflective optical element and a refractive optical element. In addition, the projection system PL may form either an inverted image or an upright image.

A plurality of optical elements of the projection optical system PL is held on a holding member (lens barrel) 21. The holding member 21 includes a flange 21F. The projection optical system PL is supported on the first surface plate 13 with the flange 21F disposed therebetween. An anti-vibration device may be provided between the first surface plate 13 and the holding member 21.

The projection optical system PL includes an emission surface 23 from which the exposure light EL is emitted toward the image plane of the projection optical system PL. The emission surface 23 is disposed on a terminating optical element 22 which is closest to the image plane of the projection optical system PL among the plurality of optical elements of the projection optical system PL. The projection region PR includes a position which can be irradiated with the exposure light EL emitted from the emission surface 23. In the present embodiment, the emission surface 23 faces the −Z direction and is parallel to the XY plane. The emission surface 23 facing the −Z direction may be a convex surface and may be a concave surface.

In the present embodiment, the optical axis (an optical axis near the image plane of the projection optical system PL) AX of the terminating optical element 22 is approximately parallel to the Z axis. In addition, an optical axis defined by an optical element adjacent to the terminating optical element 22 may be regarded as the optical axis of the terminating optical element 22. Moreover, in the present embodiment, the image plane of the projection optical system PL is approximately parallel to the XY plane that includes the X and Y axes. Furthermore, in the present embodiment, the image plane is approximately horizontal. However, the image plane may not be parallel to the XY plane and may be a curved surface.

The substrate stage 2 includes a substrate holder 24 that releasably holds the substrate P, and is movable on a guide surface 18G of the third surface plate 18. The substrate stage 2 is movable relative to the projection region PR while holding the substrate P by the operation of a driving system 25. The driving system 25 includes a planar motor which includes a movable member 25A disposed on the substrate stage 2 and a stationary member 25B disposed on the third surface plate 18. A planar motor capable of moving the substrate stage 2 is disclosed in the specification of U.S. Pat. No. 6,452,292, for example. The substrate stage 2 is movable in the six directions of the X, Y, and Z-axis directions and the θX, θY, and θZ directions by the operation of the driving system 25.

The substrate stage 2 includes an upper surface 26 which is disposed around the substrate holder 24 so as to face the emission surface 23. In the present embodiment, the substrate stage 2 includes a plate member holder 27 that is disposed in at least a part of the circumference of the substrate holder 24 so as to releasably hold the lower surface of a plate member T, as disclosed in the specification and the like of US Patent Application Publication No. 2007/0177125. In the present embodiment, the upper surface 26 of the substrate stage 2 includes the upper surface of the plate member T. The upper surface 26 is flat. The plate member T may not be releasable from the substrate stage 2.

In the present embodiment, the substrate holder 24 is capable of holding the substrate P so that the surface of the substrate P is approximately parallel to the XY plane. The plate member holder 27 is capable of holding the plate member T so that the upper surface 26 of the plate member T is approximately parallel to the XY plane.

The interferometer system 3 includes a first interferometer device 3A capable of optically measuring the position of the mask stage 1 (the mask M) within the XY plane and a second interferometer device 3B capable of optically measuring the position of the substrate stage 2 (the substrate P) within the XY plane. When executing an exposure process on the substrate P or executing a predetermined measurement process, the control device 7 operates the driving systems 20 and 25 based on the results of the measurement by the interferometer system 3 to thereby control the positions of the mask stage 1 (the mask M) and the substrate stage 2 (the substrate P).

The liquid immersion member 4 is disposed in at least a part of the circumference of the optical path of the exposure light EL. In the present embodiment, at least a part of the liquid immersion member 4 is disposed in at least a part of the circumference of the terminating optical element 22. In the present embodiment, the liquid immersion member 4 is supported on a supporting mechanism 28. In the present embodiment, the supporting mechanism 28 is supported on the first surface plate 13. In the present embodiment, the liquid immersion member 4 is suspended on the first surface plate 13 with the supporting mechanism 28 disposed therebetween.

The exposure apparatus EX of the present embodiment is a scanning exposure apparatus (commonly called a scanning stepper) which projects the image of the pattern on the mask M onto the substrate P while moving the mask M and the substrate P in a predetermined scanning direction in a synchronized manner. When exposing the substrate P, the control device 7 controls the mask stage 1 and the substrate stage 2 so as to move the mask M and the substrate P in a predetermined scanning direction within the XY plane crossing the optical axis AX (the optical path of the exposure light EL). In the present embodiment, the scanning direction (synchronized moving direction) of the substrate P is the Y-axis direction, and the scanning direction (synchronized moving direction) of the mask M is also the Y-axis direction. The control device 7 irradiates the substrate P with the exposure light EL via the projection optical system PL and the liquid LQ in the liquid immersion space LS on the substrate P while moving the substrate P in the Y-axis direction relative to the projection region PR of the projection optical system PL and moving the mask M in the Y-axis direction relative to the illumination region IR of the illumination system IL in synchronization with the movement of the substrate P in the Y-axis direction. In this way, the image of the pattern on the mask M is projected onto the substrate P, and the substrate P is exposed with the exposure light EL.

Figure 2:
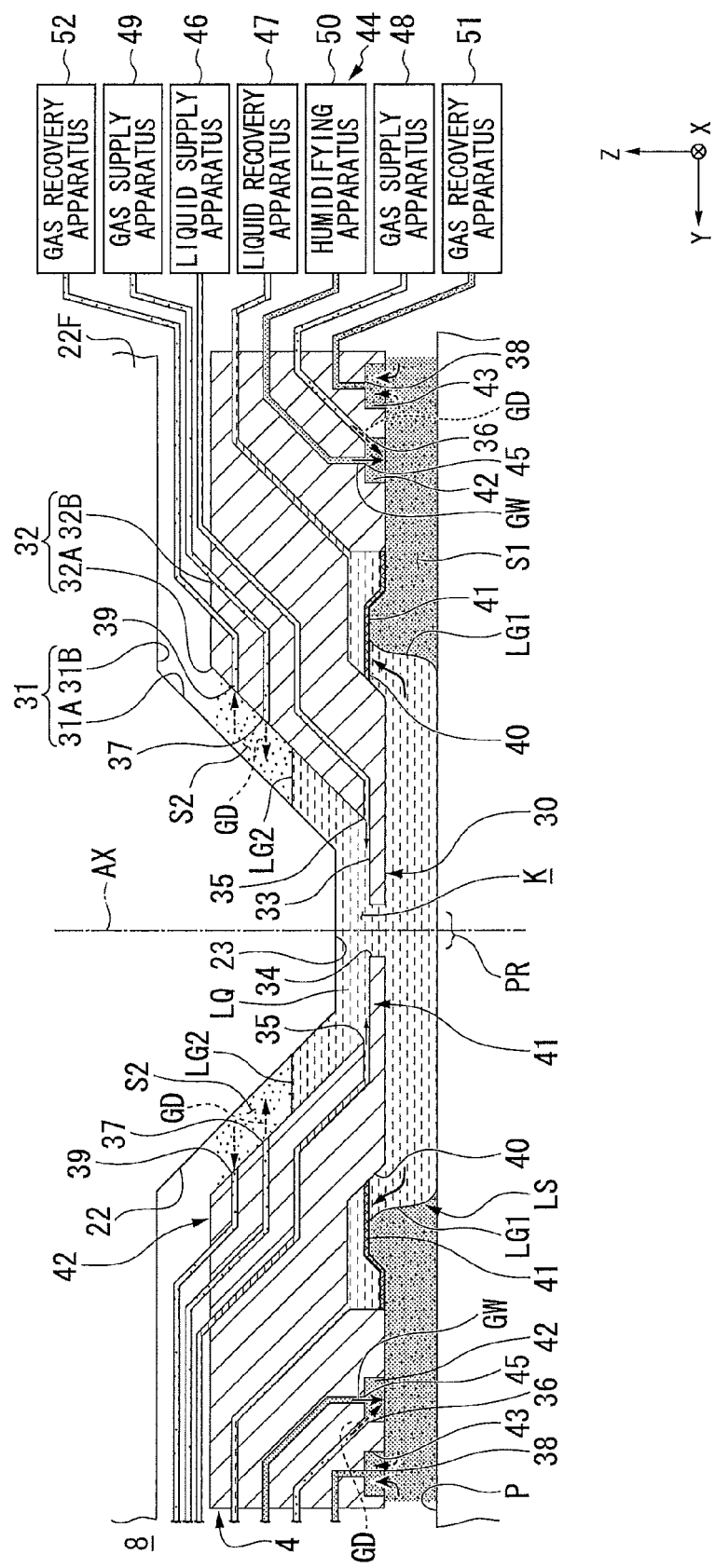
FIG. 2 is a cross-sectional view showing the vicinity of a terminating optical element and a liquid immersion member according to the first embodiment.
Figure 3:
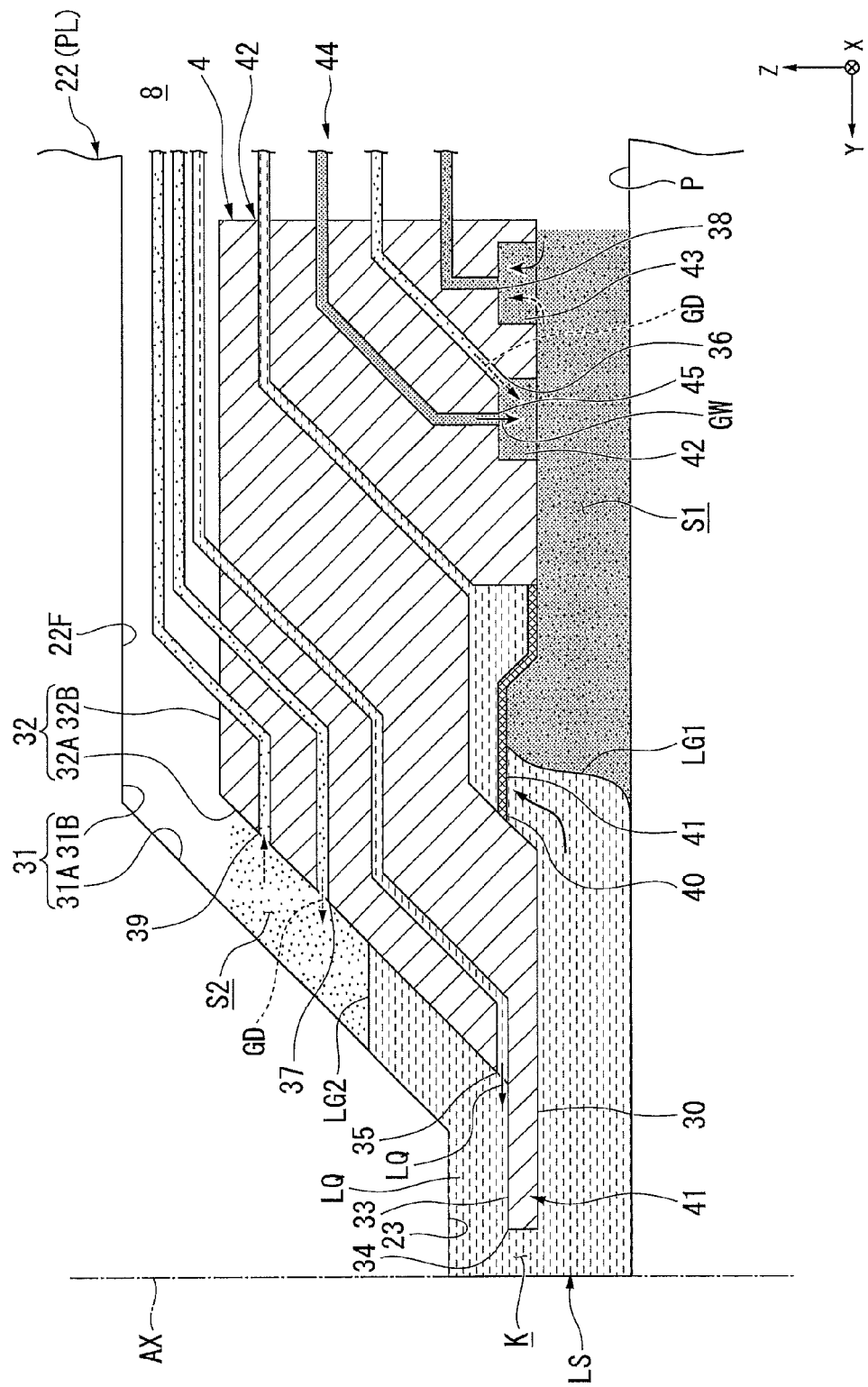
FIG. 3 is a cross-sectional view showing the vicinity of the liquid immersion member according to the first embodiment.

Next, the liquid immersion member 4 will be described with reference to FIGS. 2 and 3. FIG. 2 is a side cross-sectional view showing the vicinity of the liquid immersion member 4, and FIG. 3 is an enlarged view of a part of FIG. 2.

In the present embodiment, the liquid immersion member 4 is an annular member. At least a part of the liquid immersion member 4 is disposed around a part of the optical path of the exposure light EL and the terminating optical element 22. In the present embodiment, the outer shape of the liquid immersion member 4 within the XY plane is circular. The outer shape of the liquid immersion member 4 may be other shapes (for example, a rectangular shape).

The liquid immersion member 4 includes a lower surface 30 which is configured to face the surface (upper surface) of an object disposed at a position facing the emission surface 23. The liquid immersion member 4 forms the liquid immersion space LS so that an optical path K of the exposure light EL between the emission surface 23 and an object disposed at the position facing the emission surface 23 is filled with the liquid LQ. The liquid LQ is held between the surface (upper surface) of the object facing the lower surface 30 of the liquid immersion member 4 and at least a part of the lower surface 30 of the liquid immersion member 4, and a part of the liquid immersion space LS is formed between the surface of the object and the lower surface 30 of the liquid immersion member 4. Moreover, in the present embodiment, a part of the liquid immersion space LS is formed between the surface of the object and the terminating optical element 22, and between the terminating optical element 22 and the liquid immersion member 4. That is, in the present embodiment, the liquid LQ in the liquid immersion space LS includes the liquid LQ held between the liquid immersion member 4 and the object, the liquid LQ held between the terminating optical element 22 and the object, and the liquid LQ held between the liquid immersion member 4 and the terminating optical element 22.

In the present embodiment, an object that is movable to the position facing the emission surface 23 includes at least one of the substrate stage 2 (the plate member T) and the substrate P held on the substrate stage 2. During exposure of the substrate P, the liquid immersion member 4 forms the liquid immersion space LS so that the optical path K of the exposure light EL is filled with the liquid LQ.

Hereinafter, for the sake of simplicity, a case where the substrate P is disposed at the position facing the emission surface 23 and the lower surface 30, and the liquid LQ is held between the liquid immersion member 4 and the substrate P, whereby the liquid immersion space LS is formed will be described as an example. In addition, the liquid immersion space LS may be formed between the terminating optical element 22 and the liquid immersion member 4 and other members (the plate member T of the substrate stage 2, or the like).

In the present embodiment, the liquid immersion space LS is formed so that a partial region of the surface of the substrate P including the projection region PR is covered with the liquid LQ when the substrate P is irradiated with the exposure light EL. The exposure apparatus EX of the present embodiment employs a local liquid immersion method.

In the present embodiment, a gas-liquid interface (meniscus) of the liquid LQ in the liquid immersion space LS includes a first interface LG1 disposed between the lower surface 30 of the liquid immersion member 4 and the surface of the substrate P and a second interface LG2 disposed between a side surface 31 of the projection optical system PL different from the emission surface 23 and an inner surface 32 of the liquid immersion member 4 different from the lower surface 30.

The lower surface 30 of the liquid immersion member 4 is disposed in at least a part of the circumference of the optical path K of the exposure light EL emitted from the emission surface 23 of the projection optical system PL. The lower surface 30 is configured to face the surface of the substrate P disposed at the position which can be irradiated with the exposure light EL emitted from the emission surface 23. The emission surface 23 and the lower surface 30 are configured to face the surface of the substrate P disposed below the liquid immersion member 4. The emission surface 23 and the lower surface 30 face the surface of the substrate P during at least a part of the exposure period for the substrate P.

The side surface 31 of the projection optical system PL includes an outer side surface 31A of the terminating optical element 22 disposed around the emission surface 23 and a lower surface 31B that is disposed around the outer side surface 31A and faces downward. The outer side surface 31A and the lower surface 31B are surfaces through which the exposure light EL does not pass.

The inner surface 32 of the liquid immersion member 4 faces at least a part of the side surface 31 of the projection optical system PL at an upper side than the emission surface 23. The inner surface 32 of the liquid immersion member 4 includes an inner side surface 32A of the liquid immersion member 4 facing the outer side surface 31A and an upper surface 32B of the liquid immersion member 4 facing the lower surface 31B. In the present embodiment, the interface LG2 is disposed between the outer side surface 31A and the inner side surface 32A.

In the present embodiment, the liquid immersion member 4 includes a plate portion 41 which is disposed so that at least a part thereof faces the emission surface 23 and a body portion 42 in which at least a part thereof is disposed around the terminating optical element 22. The lower surface 30 is disposed on the plate portion 41 and the body portion 42. The inner side surface 32A and the upper surface 32B are disposed on the body portion 42. The inner side surface 32A faces the outer side surface 31A via a gap. The upper surface 32B faces the lower surface 31B via a gap.

In the present embodiment, the upper surface 32B faces at least a part of the surface of the terminating optical element 22. In the present embodiment, the terminating optical element 22 includes a flange portion 22F disposed around the outer side surface 31A, and the lower surface 31B includes the lower surface of the flange portion 22F. In addition, the upper surface 32B may face the surface (lower surface) of the holding member 21 of the projection optical system PL, and may face both the surface of the terminating optical element 22 and the surface of the holding member 21. Moreover, at least a part of the inner side surface 32A may face a part of the holding member 21, and may face the terminating optical element 22 and the holding member 21.

Moreover, the plate portion 41 of the liquid immersion member 4 is disposed in at least a part of the circumference of the optical path K of the exposure light EL, and includes an upper surface 33 in which at least a part thereof faces the emission surface 23. The upper surface 33 faces in the reverse direction of the lower surface 30.

The liquid immersion member 4 (the plate portion 41) includes an opening 34 that the exposure light EL emitted from the emission surface 23 can pass. The lower surface 30 and the upper surface 33 are disposed around the opening 34. During exposure of the substrate P, the exposure light EL emitted from the emission surface 23 is irradiated on the surface of the substrate P through the opening 34. In the present embodiment, the opening 34 is long in the X-axis direction crossing the scanning direction (Y-axis direction) of the substrate P.

In the present embodiment, the liquid immersion member 4 includes a liquid supply port 35 for supplying the liquid LQ in order to fill the optical path K of the exposure light EL with the liquid LQ, a gas supply port 36 for supplying a gas GD including a material capable of changing the specific resistance of the liquid LQ to at least a part of a space S1 around the liquid immersion space LS formed by the liquid LQ, and a gas supply port 37 disposed at a position different from the gas supply port 36 so as to supply a gas GD including a material capable of changing the specific resistance of the liquid LQ to at least a part of a space S2 around the liquid immersion space LS.

The gas supply port 36 supplies the gas GD to at least a part of a space between the liquid immersion member 4 and the substrate P. The gas supply port 36 supplies the gas GD to at least a part of the space S1 around the interface LG1, located between the lower surface 30 of the liquid immersion member 4 and the surface of the substrate P.

The gas supply port 37 supplies the gas GD to at least a part of a space between the projection optical system PL and the liquid immersion member 4. The gas supply port 37 supplies the gas GD to at least a part of the space S2 around the interface LG2, located between the side surface 31 of the projection optical system PL and the inner surface 32 of the liquid immersion member 4. In the present embodiment, the gas GD supplied from the gas supply ports 36 and 37 includes a larger amount of the material that changes (decreases) the specific resistance of the liquid LQ than the gas in the inner space 8 controlled by the chamber device 5 (the environment control device 5B). That is, in the present embodiment, by supplying the gas GD from the gas supply ports 36 and 37, the gas spaces S1 and S2 in which the concentration (proportion) of the material that changes the specific resistance of the liquid LQ is higher than that of the inner space 8 are formed in at least a part of the circumference of the liquid immersion space LS.

In the present embodiment, the material capable of changing the specific resistance of the liquid LQ is carbon dioxide. The gas supply ports 36 and 37 supply the gas (carbonic acid gas) GD including carbon dioxide.

Carbon dioxide is soluble in the liquid LQ supplied from the liquid supply port 35. Moreover, carbon dioxide can decrease the specific resistance of the liquid LQ.

At least some of the gas GD supplied from the gas supply port 36 to the space S1 between the lower surface 30 of the liquid immersion member 4 and the surface of the substrate P comes into contact with the interface LG1. The gas GD including carbon dioxide supplied so as to come into contact with the interface LG1 is dissolved in the liquid LQ, whereby the specific resistance of the liquid LQ is decreased.

That is, in the present embodiment, the gas GD including carbon dioxide supplied to the space S1 around the interface LG1 of the liquid immersion space LS is mixed into and dissolved in some of the liquid LQ in the vicinity of the interface LG1. In this way, some of the liquid LQ (pure water) which is supplied from the liquid supply port 35 and present in the vicinity of the interface LG1 is changed into carbonated water. Thus, the specific resistance of the liquid LQ in the vicinity of the interface LG1 decreases.

As above, in the present embodiment, the gas GD supplied to the space S1 is dissolved in some of the liquid LQ in the liquid immersion space LS, located between the liquid immersion member 4 and the substrate P, whereby the specific resistance of some of the liquid LQ is decreased. Thus, charging of the liquid LQ in the vicinity of the interface LG1 is suppressed.

Similarly, at least some of the gas GD supplied from the gas supply port 37 to the space between the side surface 31 of the projection optical system PL and the inner surface 32 of the liquid immersion member 4 comes into contact with the interface LG2. The gas GD including carbon dioxide supplied so as to come into contact with the interface LG2 is dissolved in the liquid LQ in the vicinity of the interface LG2, whereby the specific resistance of the liquid LQ in the vicinity of the interface LG2 is decreased. Thus, the specific resistance of the liquid LQ in the vicinity of the interface LG2 decreases.

In addition, the gas GD may be composed only of carbon dioxide (conductive adhesive agent), and may be a mixed gas of carbon dioxide and other gases (clean air or the like), for example.

The material capable of changing the specific resistance of the liquid LQ may not be carbon dioxide but may be ozone or hydrogen, for example. Such materials can decrease the specific resistance of the liquid LQ by being mixed into the liquid LQ. Moreover, the gas GD may include two or more kinds of materials capable of changing the specific resistance of the liquid LQ, and may include two or more kinds of optional materials selected from carbon dioxide, ozone, and hydrogen described above, for example.

Moreover, in the present embodiment, the liquid immersion member 4 includes a gas recovery port 38 for recovering at least some of the gas GD and a gas recovery port 39 disposed at a position different from the gas recovery port 38 so as to recover at least some of the gas GD. The gas recovery port 38 recovers at least some of the gas GD in the space S1 around the interface LG1, located between the lower surface 30 of the liquid immersion member 4 and the surface of the substrate P. The gas recovery port 39 recovers at least some of the gas GD in the space S2 around the interface LG2, located between the side surface 31 of the projection optical system PL and the inner surface 32 of the liquid immersion member 4.

Moreover, in the present embodiment, the liquid immersion member 4 includes a liquid recovery port 40 for recovering at least some of the liquid LQ.

In the present embodiment, the liquid supply port 35 supplies the liquid LQ to the space between the liquid immersion member 4 and the terminating optical element 22. In the present embodiment, the liquid supply port 35 is disposed on the inner side surface 32A. In the present embodiment, the liquid supply port 35 is disposed on a predetermined portion of the liquid immersion member 4 so as to face the optical path K. In the present embodiment, the liquid supply port 35 supplies the liquid LQ to the space between the emission surface 23 and the upper surface 33.

In addition, the liquid supply port 35 may be disposed on the inner side surface 32A so as to face the outer side surface 31A and may supply the liquid LQ to the space between the outer side surface 31A and the inner side surface 32A.

In the present embodiment, the liquid supply port 35 is disposed on each of the +Y and −Y sides in relation to the opening 34 (the optical path K of the exposure light EL). In addition, the liquid supply port 35 may be disposed on each of the +X and −X sides in relation to the opening 34 (the optical path K of the exposure light EL). Moreover, the number of liquid supply ports 35 is not limited to two. The liquid supply port 35 may be disposed at three or more positions around the optical path K of the exposure light EL.

The liquid LQ from the liquid supply port 35 is supplied to the optical path K of the exposure light EL. In this way, the optical path K of the exposure light EL is filled with the liquid LQ.

In the present embodiment, the liquid recovery port 40 is disposed on at least a part of the lower surface 30. In the present embodiment, the surface of the substrate P disposed below the liquid immersion member 4 is configured to face the liquid recovery port 40.

In the present embodiment, the liquid recovery port 40 is disposed on the lower surface 30 in at least a part of the circumference of the optical path K (the optical axis AX). The liquid recovery port 40 is capable of recovering the liquid LQ on the substrate P (object) disposed at the position facing the lower surface 30. In the present embodiment, the shape of the liquid recovery port 40 within the XY plane is ring-shaped (circular and annular).

In addition, the shape of the liquid recovery port 40 within the XY plane may be rectangular and annular. Moreover, the liquid recovery port 40 may be disposed in at least a part of the circumference of the optical path K. For example, the liquid recovery port 40 may be disposed on only one side (+Y side) and the other side (−Y side) in the scanning direction of the substrate P in relation to the optical path K (opening 34), and a plurality of liquid recovery ports 40 may be disposed on the lower surface 30 around the optical path K at predetermined intervals.

In the present embodiment, a porous member 41 is disposed in the liquid recovery port 40. The porous member 41 is a plate-shaped member including a plurality of openings or pores. In addition, the porous member 41 may be a mesh filter which is a porous member 41 in which a number of small openings or pores are formed in a network shape. The liquid recovery port 40 recovers the liquid LQ on the substrate P through the openings or pores of the porous member 41.

In the present embodiment, the operation of recovering the liquid LQ by the liquid recovery port 40 is executed concurrently with the operation of supplying the liquid LQ by the liquid supply port 35 during at least a part of the exposure period for the substrate P. During at least a part of the exposure period for the substrate P, at least some of the liquid LQ supplied from the liquid supply port 35 to the space between the emission surface 23 and the upper surface 33 is supplied to the space between the lower surface 30 and the surface of the substrate P through the opening 34, whereby the optical path K of the exposure light EL is filled with the liquid LQ. Moreover, some of the liquid LQ is held between the lower surface 30 and the surface of the substrate P. Since the operation of recovering the liquid LQ by the liquid recovery port 40 is executed concurrently with the operation of supplying the liquid LQ by the liquid supply port 35, the size (volume) of the liquid immersion space LS formed between the liquid immersion member 4 and the substrate P is determined. The substrate P is exposed with the exposure light EL from the emission surface 23 via the liquid LQ between the emission surface 23 and the surface of the substrate P.

The gas supply port 36 is disposed on a predetermined portion of the liquid immersion member 4 so as to face the space S1. In the present embodiment, the gas supply port 36 is disposed on at least a part of the lower surface 30.

The gas supply port 36 is disposed on the outer side of the liquid recovery port 40 in the radiation direction in relation to the optical axis AX. The gas supply port 36 is disposed on at least a part of the lower surface 30 around the optical path K (the optical axis AX). In the present embodiment, the gas supply port 36 is disposed at a position where it does not come into contact with the liquid LQ. That is, the gas supply port 36 is disposed on the outer side of the interface LG1 in the radiation direction in relation to the optical axis AX.

In the present embodiment, the gas supply port 36 supplies the gas GD toward the surface of the substrate P facing the gas supply port 36. In addition, the gas supply port 36 may supply the gas GD toward the inner side (toward the interface LG1) in the radiation direction in relation to the optical axis AX.

In the present embodiment, the gas supply port 36 is disposed in at least a part of the circumference of the optical path K (the optical axis AX). In the present embodiment, the shape of the gas supply port 36 within the XY plane is ring-shaped (circular and annular). In the present embodiment, the gas supply port 36 is a slit opening that is formed so as to surround the optical path K of the exposure light EL. In addition, the shape of the gas supply port 36 within the XY plane may be rectangular or annular.

In the present embodiment, a concave portion 42 is formed on at least a part of the lower surface 30. The concave portion 42 is recessed so as to be away from the surface of the substrate P facing the lower surface 30. In the present embodiment, the gas supply port 36 is disposed on the inner surface of a concave portion that defines the concave portion 42.

In the present embodiment, the shape of the concave portion 42 within the XY plane is ring-shaped (circular and annular). In addition, the shape of the concave portion 42 within the XY plane may be rectangular or annular.

The gas supply port 36 may be disposed in at least a part of the circumference of the optical path K (the optical axis AX). For example, a plurality of gas supply ports 36 may be disposed on the lower surface 30 around the optical path K at predetermined intervals. In this case, a plurality of concave portions 42 may be disposed on the lower surface 30 at predetermined intervals, and at least one gas supply port 36 may be disposed in a part or all of the plurality of concave portions 42.

The plurality of gas supply ports 36 may be disposed to be separated in the radiation direction in relation to the optical axis AX. For example, the gas supply port 36 may include a first annular gas supply port disposed around the optical path K and a second gas supply port disposed on the outer side of the first gas supply port so as to be approximately concentric to the first gas supply port. In this case, both the first and second gas supply ports may be disposed on the inner surface of the concave portion 42, and any one of the first and second gas supply ports may be disposed on the lower surface 30 on the outer side of the concave portion 42, and the other may be disposed on the inner surface of the concave portion 42.

The concave portion 42 may not be provided, and the gas supply port 36 may be disposed on the lower surface 30.

The gas recovery port 38 is disposed in the liquid immersion member 4 so as to face the space S1. In the present embodiment, the gas recovery port 38 is disposed on at least a part of the lower surface 30.

In the present embodiment, the gas recovery port 38 is disposed on the outer side of the gas supply port 36 in the radiation direction in relation to the optical axis AX. The gas recovery port 38 is disposed on at least a part of the lower surface 30 around the gas supply port 36. The gas recovery port 38 is capable of recovering at least a part of the gas GD in the space S1 around the interface LG1.

In the present embodiment, the shape of the gas recovery port 38 within the XY plane is ring-shaped (circular and annular). In the present embodiment, the gas recovery port 38 is a slit opening that is formed so as to surround the optical path K of the exposure light EL. In addition, the shape of the gas recovery port 38 within the XY plane may be rectangular or annular.

In the present embodiment, a concave portion 43 is formed on at least a part of the lower surface 30. The concave portion 43 is recessed so as to be away from the surface of the substrate P facing the lower surface 30. The concave portion 43 is disposed around the optical path K (the optical axis AX). The concave portion 43 is disposed on the outer side of the concave portion 42 in the radiation direction in relation to the optical axis AX. In the present embodiment, the gas recovery port 38 is disposed on the inner surface of the concave portion 43 that defines the concave portion 43.

In the present embodiment, the shape of the concave portion 43 within the XY plane is ring-shaped (circular and annular). In addition, the shape of the concave portion 43 within the XY plane may be rectangular and annular.

The gas recovery port 38 may be disposed in at least a part of the circumference of the gas supply port 36. For example, a plurality of gas recovery ports 38 may be disposed on the lower surface 30 around the optical path K (the optical axis AX) at predetermined intervals. In this case, a plurality of concave portions 43 may be disposed on the lower surface 30 around the optical path K at predetermined intervals, and at least one gas recovery port 38 may be disposed in each of the plurality of concave portions 43. Moreover, the plurality of gas recovery ports 38 may be disposed so as to be separated in the radiation direction in relation to the optical axis AX. In this case, both a gas recovery port located closest to the optical path K (the optical axis AX) and a gas recovery port located farther from the optical axis AX than the first gas recovery port may be disposed on the inner surface of the concave portion 43, and any one of them may be disposed on the inner surface of the concave portion 43.

In the present embodiment, a humidifying system 44 is provided so as to make the humidity of the space S1 supplied with the gas GD from the gas supply port 36 higher than the humidity of the inner space 8 controlled by the chamber device 5 (the environment control device 5B). The humidifying system 44 humidifies the gas GD with the steam GW of the liquid LQ.

In the present embodiment, the humidifying system 44 includes an air supply port 45 for supplying the steam GW of the liquid LQ to the space S1. In the present embodiment, the air supply port 45 is disposed on the lower surface 30 of the liquid immersion member 4 so as to face the space S1.

In the present embodiment, the inner space 8 of the chamber device 5 is filled with clean air, and the air supply port 45 supplies air humidified by water vapor to the space S1.

In the present embodiment, the air supply port 45 is disposed in the vicinity of the gas supply port 36. In the present embodiment, the air supply port 45 is disposed on the inner surface of the concave portion 42.

In the present embodiment, the shape of the air supply port 45 within the XY plane is ring-shaped (circular and annular). In the present embodiment, the air supply port 45 is a slit opening that is formed so as to surround the optical path K of the exposure light EL. In addition, the shape of the air supply port 45 within the XY plane may be rectangular and annular.

A plurality of air supply ports 45 may be disposed so as to be separated in the radiation direction in relation to the optical axis AX. Moreover, the air supply port 45 may be disposed in at least a part of the circumference of the optical path K. For example, a plurality of air supply ports 45 may be disposed on the lower surface 30 around the optical path K at predetermined intervals. Moreover, the air supply port 45 may be disposed on the lower surface 30 on the outer side of the concave portion 42. Furthermore, a part of the plurality of air supply ports 45 may be disposed on the concave portion 42, and the remaining air supply ports may be disposed on the lower surface 30 on the outer side of the concave portion 42.

The gas supply port 37 is disposed on a predetermined portion of the liquid immersion member 4 so as to face the space S2. In the present embodiment, the gas supply port 37 is disposed on at least a part of the inner side surface 32A.

The gas supply port 37 is disposed above the emission surface 23. The gas supply port 37 is disposed at a position where it does not come into contact with the liquid LQ. That is, the gas supply port 37 is disposed above the interface LG2.

In the present embodiment, the gas supply port 37 supplies the gas GD toward the outer side surface 31A of the terminating optical element 22 facing the gas supply port 37. In addition, the gas supply port 37 may supply the gas GD toward the lower side (toward the interface LG2).

In the present embodiment, the gas supply port 37 is annular. In the present embodiment, the gas supply port 37 is a slit opening that is formed so as to surround the outer side surface 31A.

The gas supply port 37 may be disposed around a part of the optical axis AX. For example, a plurality of gas supply ports 37 may be disposed on the inner side surface 32A around the optical axis AX at predetermined intervals.

The gas recovery port 39 is disposed in the liquid immersion member 4 so as to face the space S2. In the present embodiment, the gas recovery port 39 is disposed on at least a part of the inner side surface 32A.

The gas recovery port 39 is disposed above the gas supply port 37. In the present embodiment, the gas recovery port 39 is annular. In the present embodiment, the gas recovery port 39 is a slit opening that is formed so as to surround the outer side surface 31A.

The gas recovery port 39 may be disposed around a part of the optical path K. For example, a plurality of gas recovery ports 39 may be disposed on the inner side surface 32A around the optical axis AX at predetermined intervals.

The gas supply port 37 and the gas recovery port 39 may be disposed on the upper surface 32B. Moreover, the gas supply port 37 may be disposed on the inner side surface 32A, and the gas recovery port 39 may be disposed on the upper surface 32B.

As shown in FIG. 2, the liquid supply port 35 is connected to a liquid supply apparatus 46 through a supply flow channel. The supply flow channel includes an inner flow channel of the liquid immersion member 4 and a flow channel of a supply pipe that connects the inner flow channel and the liquid supply apparatus 46. The liquid supply apparatus 46 supplies clean and temperature-adjusted liquid LQ to the liquid supply port 35.

The liquid recovery port 40 is connected to a liquid recovery apparatus 47 through a recovery flow channel. In the present embodiment, the recovery flow channel includes an inner flow channel of the liquid immersion member 4 and a flow channel of a recovery pipe that connects the inner flow channel and the liquid recovery apparatus 47. The liquid recovery apparatus 47 includes a vacuum system (a valve or the like that controls the connection state between a vacuum source and the liquid recovery port 40) and is capable of sucking and recovering the liquid LQ from the liquid recovery port 40.

In the present embodiment, the control device 7 is capable of controlling the liquid recovery apparatus 47 to control a pressure difference between the upper surface side and the lower surface side of the porous member 41 so that only the liquid LQ passes from the lower surface-side space of the porous member 41 (the space between the lower surface of the porous member 41 and the surface of the substrate P) toward the upper surface-side space (the recovery flow channel). In the present embodiment, the lower surface-side space is open to the atmosphere and the pressure thereof is controlled by the chamber device 5. The control device 7 controls the liquid recovery apparatus 47 so as to adjust the pressure of the upper surface side in accordance with the pressure of the lower surface side so that only the liquid LQ passes from the lower surface side of the porous member 41 toward the upper surface side. That is, the control device 7 adjusts the pressure of the upper surface-side space so that gas does not pass through the openings or pores of the porous member 41. A technique of adjusting the pressure difference between one side and the other side of the porous member 41 so that only the liquid LQ passes from one side of the porous member 41 toward the other side is disclosed in the specification and the like of U.S. Pat. No. 7,292,313, for example.

In the present embodiment, "atmosphere" is gas surrounding the liquid immersion member 4. In the present embodiment, the gas surrounding the liquid immersion member 4 is the gas in the inner space 8 which is formed by the chamber device 5. In the present embodiment, the chamber device 5 fills the inner space 8 with clean air using the environment control device 5B. Moreover, the chamber device 5 adjusts the pressure of the inner space 8 to approximately atmospheric pressure using the environment control device 5B. Naturally, the pressure of the inner space 8 may be set to be higher than the atmospheric pressure.

In the present embodiment, the space between the side surface 31 of the projection optical system PL and the inner surface 32 of the liquid immersion member 4 is open to the atmosphere. Moreover, the space between the lower surface 30 of the liquid immersion member 4 and the surface of the substrate P is also open to the atmosphere.

The gas supply port 36 is connected to a gas supply apparatus 48 through a gas supply flow channel. The gas supply flow channel includes an inner flow channel of the liquid immersion member 4 and a flow channel of a gas supply pipe that connects the inner flow channel and the gas supply apparatus 48. The gas supply apparatus 48 can supply clean and temperature-adjusted gas GD to the gas supply port 36.

Similarly, the gas supply port 37 is connected to a gas supply apparatus 49 through a gas supply flow channel.

The air supply port 45 is connected to a humidifying apparatus 50 through a supply flow channel. The supply flow channel includes an inner flow channel of the liquid immersion member 4 and a flow channel of a supply pipe that connects the inner flow channel and the humidifying apparatus 50. The humidifying apparatus 50 supplies the steam GW of the liquid LQ to the air supply port 45.

The gas recovery port 38 is connected to a gas recovery apparatus 51 through a recovery flow channel. In the present embodiment, the recovery flow channel includes an inner flow channel of the liquid immersion member 4 and a flow channel of a recovery pipe that connects the inner flow channel and the gas recovery apparatus 51. The gas recovery apparatus 51 includes a vacuum system and is capable of sucking and recovering gas in the space S1 from the gas recovery port 38.

Similarly, the gas recovery port 39 is connected to a gas recovery apparatus 52 through a recovery flow channel.

Next, a method of exposing the substrate P using the exposure apparatus EX having the configuration described above will be described.

First, the control device 7 causes the emission surface 23 of the projection optical system PL and the lower surface 30 of the liquid immersion member 4 to face the surface of the substrate P (or the upper surface 26 of the substrate stage 2).

The control device 7 causes the liquid LQ to be delivered from the liquid supply apparatus 46 in a state where the emission surface 23 and the lower surface 30 face the surface of the substrate P. Moreover, the control device 7 operates the liquid recovery apparatus 47. The liquid LQ delivered from the liquid supply apparatus 46 is supplied to the liquid supply port 35. The liquid supply port 35 supplies the liquid LQ to the space between the emission surface 23 and the upper surface 33 so that the optical path K between the emission surface 23 and the surface of the substrate P is filled with the liquid LQ. The liquid LQ supplied from the liquid supply port 35 to the space between the emission surface 23 and the upper surface 33 is supplied to the optical path K of the exposure light EL emitted from the emission surface 23. In this way, the optical path K of the exposure light EL is filled with the liquid LQ.

Moreover, at least some of the liquid LQ supplied from the liquid supply port 35 is supplied to the space between the lower surface 30 and the surface of the substrate P through the opening 34 and is held between the lower surface 30 and the surface of the substrate P. In this way, the liquid immersion space LS is formed by the liquid LQ supplied from the liquid supply port 35 so that the optical path K of the exposure light EL, located between the emission surface 23 and the substrate P is filled with the liquid LQ.

At least some of the liquid LQ between the lower surface 30 and the surface of the substrate P is recovered through the liquid recovery port 40. The liquid LQ recovered from the liquid recovery port 40 is recovered into the liquid recovery apparatus 47.

Moreover, the control device 7 causes the gas GD to be delivered from the gas supply apparatuses 48 and 49. Moreover, the control device 7 operates the gas recovery apparatuses 51 and 52. Moreover, the control device 7 operates the humidifying apparatus 50.

The gas GD delivered from the gas supply apparatus 48 is supplied to at least a part of the space S1 around the liquid immersion space LS of the liquid LQ formed on the substrate P through the gas supply port 36. Moreover, the steam GW delivered from the humidifying apparatus 50 is supplied to at least a part of the space S1 through the air supply port 45. Furthermore, the gas GD delivered from the gas supply apparatus 49 is supplied to at least a part of the space S2 around the liquid immersion space LS through the gas supply port 37.

The control device 7 controls the liquid supply apparatus 46, the liquid recovery apparatus 47, the gas supply apparatus 48, the humidifying apparatus 50, the gas recovery apparatus 51, the gas supply apparatus 49, and the gas recovery apparatus 52 so that the operation of supplying the liquid LQ by the liquid supply port 35, the operation of recovering the liquid LQ by the liquid recovery port 40, the operation of supplying the gas GD by the gas supply port 36, the operation of supplying the steam GW by the air supply port 45, the operation of recovering the gas GD and the steam GW by the gas recovery port 38, the operation of supplying the gas GD by the gas supply port 37, and the operation of recovering the gas GD by the gas recovery port 39 are executed concurrently. That is, the control device 7 supplies the gas GD and the steam GW to the space S1 around the liquid immersion space LS and recovers the gas GD and the steam GW in the space S1 in a state where the liquid immersion space LS is formed by the liquid LQ supplied from the liquid supply port 35. Moreover, the control device 7 supplies the gas GD to the space S2 around the liquid immersion space LS and recovers the gas GD in the space S2 in a state where the liquid immersion space LS is formed.

The control device 7 starts the exposure of the substrate P in a state where the liquid immersion space LS is formed. The control device 7 causes the exposure light EL to be emitted from the illumination system IL so that the mask M is illuminated with the exposure light EL. The exposure light EL from the mask M is emitted from the emission surface 23 of the projection optical system PL. The control device 7 exposes the substrate P with the exposure light EL from the emission surface 23 via the liquid LQ between the emission surface 23 and the surface of the substrate P. In this way, the image of the pattern on the mask M is projected onto the substrate P, and the substrate P is exposed with the exposure light EL. During the exposure of the substrate P, the operation of supplying the liquid LQ by the liquid supply port 35, the operation of recovering the liquid LQ by the liquid recovery port 40, the operation of supplying the gas GD by the gas supply port 36, the operation of supplying the steam GW by the air supply port 45, the operation of recovering the gas GD and the steam GW by the gas recovery port 38, the operation of supplying the gas GD by the gas supply port 37, and the operation of recovering the gas GD by the gas recovery port 39 are executed concurrently.

Since the gas GD is supplied to the space S1, charging of the liquid LQ in the vicinity of the interface LG1 is suppressed. Moreover, charging of the liquid immersion member 4 contacting the liquid LQ, charging of the substrate P, and charging of the substrate stage 2 (the plate member T) are suppressed.

In the present embodiment, since the concave portions 42 and 43 are provided, it is possible to increase the size of the space S1 in which the gas GD is filled. Thus, the gas GD in the space S1 can be smoothly dissolved in the liquid LQ, and charging can be suppressed.

Moreover, since the gas GD is supplied to the space S2, charging of the liquid LQ in the vicinity of the interface LG2 is suppressed. Moreover, charging of the liquid immersion member 4 contacting the liquid LQ and charging of the terminating optical element 22 are suppressed.

Furthermore, since the gas GD in the space S1 is recovered from the gas recovery port 38, the gas GD is suppressed from flowing into a space (the atmosphere or the inner space 8) around the liquid immersion member 4. Similarly, the gas recovery port 39 suppresses the gas GD in the space S2 from flowing into the space around the liquid immersion member 4.

Moreover, in the present embodiment, the steam GW is supplied to the space S1 in which the gas GD is supplied. By causing the gas GD and the liquid LQ to contact each other in a state where the humidity of the space S1 around the liquid immersion space LS is high, the gas GD (the material that changes the specific resistance of the liquid LQ) becomes easily dissolved in the liquid LQ. Thus, by supplying the steam GW to the space S1, dissolution of the gas GD in the liquid LQ is accelerated, and charging of the liquid LQ can be suppressed more effectively.

Moreover, by increasing the humidity of the space S1 around the liquid immersion space LS, it is possible to suppress vaporization of the liquid LQ in the liquid immersion space LS. Thus, it is possible to suppress the occurrence of a temperature change of the liquid LQ, the liquid immersion member 4, and the substrate stage 2 (the plate member T) due to vaporization heat of the liquid LQ.

The gas supply apparatus 48 may supply a humidified gas GD to the gas supply port 36. That is, the gas supply apparatus 48 may include a humidifying apparatus. In this case, the humidifying system 44 which includes the humidifying apparatus 50 and the air supply port 45 may not be provided. Moreover, the gas supply apparatus 49 may supply the humidified gas GD to the gas supply port 37.

In the present embodiment, the control device 7 may adjust at least one of the supply amount per unit time of the gas GD supplied from the gas supply port 36 to the space S1 and the supply amount per unit time of the gas GD supplied from the gas supply port 37 to the space S2. For example, a sensor capable of detecting the charge quantity of the liquid LQ is provided, and the control device 7 adjusts the supply amount of the gas GD based on the results of the detection by the sensor. For example, the control device 7 can adjust the supply amount of the gas GD based on the results of the detection by a capacitance sensor which is provided on at least a part of the liquid immersion member 4 and is capable of detecting the charge quantity of the liquid LQ. The specific resistance of the liquid LQ changes with the supply amount of the gas GD. For example, when the charge quantity of the liquid LQ is determined to be large based on the detection results from the sensor, the control device 7 increases the supply amount of the gas GD. On the other hand, when the charge quantity of the liquid LQ is determined to be small, the control device 7 decreases the supply amount of the gas GD. Moreover, the control device 7 may adjust at least one of the proportion (concentration) of the carbon dioxide included in the gas GD supplied from the gas supply port 36 and the proportion (concentration) of the carbon dioxide included in the gas GD supplied from the gas supply port 37. In this case, adjustment can be performed based on the results obtained by the sensor described above. Moreover, the control device 7 may adjust the amount (flow rate) per unit time of the steam GW supplied from the air supply port 45 to the space S1. In this case, adjustment can be performed based on the results of the detection by the sensor.

When the liquid LQ supplied from the liquid supply port 35 is pure water (ultrapure water), the possibility of charging of the liquid LQ increases. Moreover, when the surface of a member contacting the liquid LQ such as the upper surface 26 of the substrate stage 2 (the plate member T) or the surface of the substrate P has insulating properties, the possibility of charging of the member increases. For example, when the upper surface 26 of the substrate stage 2 is formed of a liquid repellent material (fluorinated material or the like) having insulating properties, the possibility of charging increases. Moreover, when the surface of the substrate P is formed of an insulating top-coat film, the possibility of charging increases. Moreover, the exposure apparatus EX of the present embodiment is a scanning exposure apparatus, in which when the substrate P (the substrate stage 2) moves in a predetermined direction within the XY plane in a state where the liquid immersion space LS is formed, the possibility that at least one of the liquid LQ and the member (the substrate P, the substrate stage 2, or the like) contacting the liquid LQ may be charged increases.

According to the present embodiment, since the gas GD including the material capable of changing the specific resistance of the liquid LQ is supplied t the spaces S1 and S2 around the liquid immersion space LS, it is possible to suppress charging of the liquid LQ and the member contacting the liquid LQ. That is, since the supplied gas GD changes the liquid LQ in the vicinity of the interfaces LG1 and LG2 into carbonated water, so that the specific resistance of the liquid LQ is changed, it is possible to suppress charging of the liquid LQ in the vicinity of the interfaces LG1 and LG2. In particular, the present embodiment is effective when the liquid LQ in the vicinity of the interfaces LG1 and LG2 is likely to be charged.

In the present embodiment, the space S1 around the interface LG1 is filled with the gas GD, and the space S2 around the interface LG2 is filled with the gas GD. Thus, the spaces S1 and S2 filled with the gas GD suppress the liquid LQ in the liquid immersion space LS from coming into contact with the gas (air in the present embodiment) in the inner space 8 controlled by the chamber device 5.

In the present embodiment, since the gas GD including the material capable of changing the specific resistance of the liquid LQ is supplied to the spaces S1 and S2 around the liquid immersion space LS formed by the liquid LQ which is supplied from the liquid supply port 35, it is possible to suppress charging of the liquid LQ in the periphery of the liquid immersion space LS and the member contacting the liquid LQ while suppressing a change in the properties of the liquid LQ in the optical path K of the exposure light EL. Therefore, it is possible to expose the substrate P satisfactorily.

As described above, according to the present embodiment, it is possible to suppress charging of the liquid LQ in the liquid immersion space LS and charging of the member contacting the liquid LQ. Thus, it is possible to suppress the occurrence of exposure defects and to suppress the occurrence of defective devices.

For example, when at least one of the liquid LQ and the member is charged, there is a possibility that foreign materials (particles) are adsorbed to the liquid LQ or the member, and exposure defects occur. Examples of foreign materials include foreign materials generated from the substrate P (flakes of part of a photosensitive film, flakes of part of an top-coat film, flakes of part of an anti-reflection film, or the like), or foreign materials floating around the substrate stage 2.

According to the present embodiment, since charging of the liquid LQ and the member contacting the liquid LQ is suppressed, it is possible to suppress foreign materials from being adsorbed to the liquid LQ and the member. Thus, it is possible to suppress the occurrence of exposure defects.

Second Embodiment

Next, the second embodiment will be described. In the following description, constituent elements which are the same as or similar to those of the above embodiment will be denoted by the same reference numerals, and description thereof will be simplified or omitted.

Figure 4:
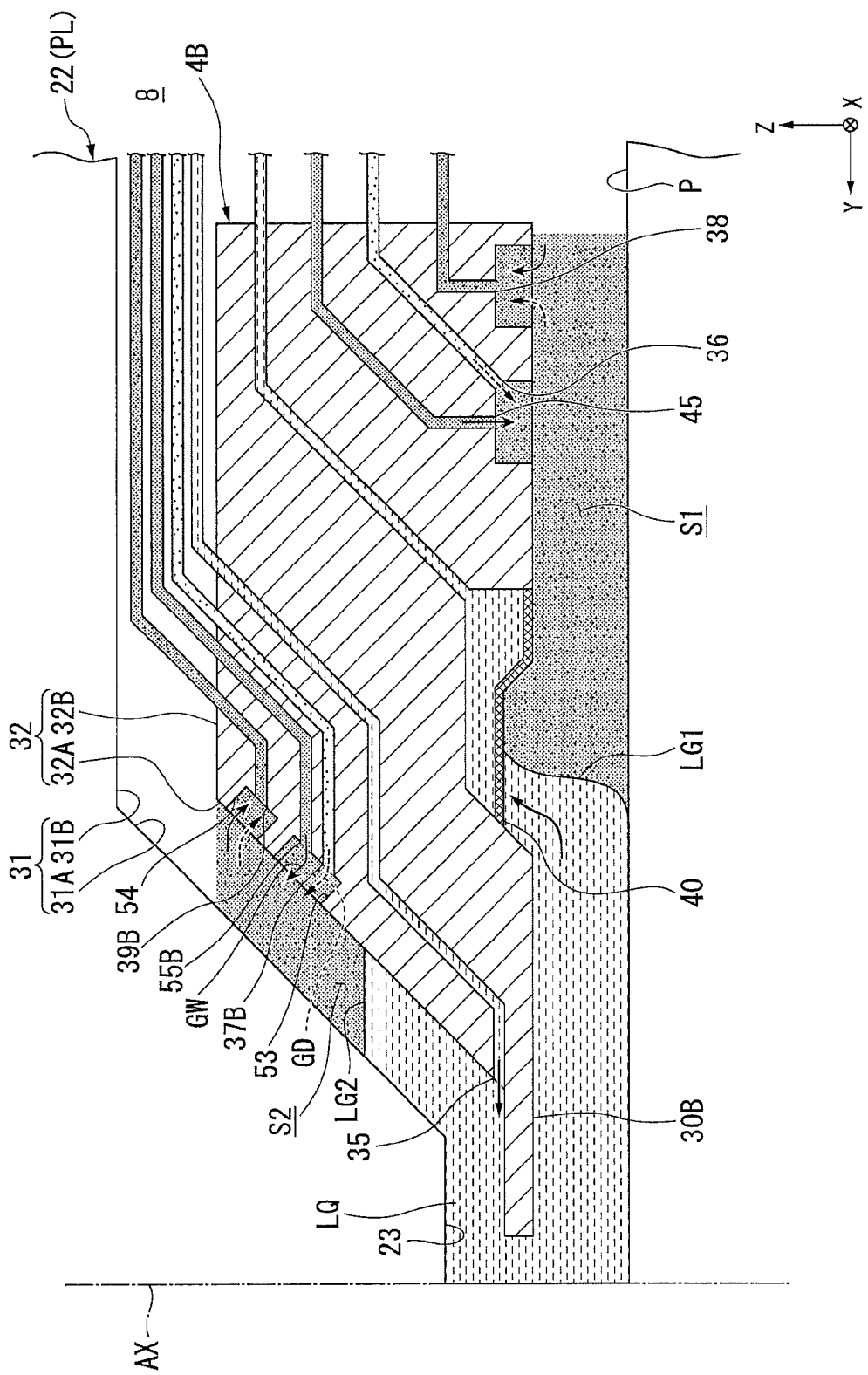
FIG. 4 is a cross-sectional view showing the vicinity of the liquid immersion member according to a second embodiment.

FIG. 4 is a view showing an example of a liquid immersion member 4B according to the second embodiment. The second embodiment is a modified example of the first embodiment. The characteristic part of the second embodiment different from the first embodiment described above is that concave portions 53 and 54 are formed on at least a part of an inner side surface 32A, a gas supply port 37B for supplying the gas GD and an air supply port 55B for supplying the steam GW are disposed on the inner surface of a concave portion 53 that defines the concave portion 53, and a gas recovery port 39B for recovering the gas GD and the steam GW is disposed on the inner surface of a concave portion 54 that defines the concave portion 54.

In FIG. 4, the concave portion 53 is recessed so as to be away from an outer side surface 31A facing the inner side surface 32A. The concave portion 53 is disposed around the outer side surface 31A. The concave portion 54 is disposed above the concave portion 53. The concave portion 54 is recessed so as to be away from the outer side surface 31A facing the inner side surface 32A. The concave portion 54 is disposed around the outer side surface 31A.

The gas supply port 37B is disposed on the inner surface of the concave portion 53. The gas supply port 37B supplies the gas GD to the space S2 between the outer side surface 31A and the inner side surface 32A. The air supply port 55B supplies the steam GW of the liquid LQ to the space S2 and makes the humidity of the space S2 supplied with the gas GD higher than the humidity of the inner space 8.

In the present embodiment, since the concave portions 53 and 54 are formed, it is possible to increase the size of the space S2 in which the gas GD is filled. Thus, the gas GD in the space S2 can be smoothly dissolved in the liquid LQ, and charging can be suppressed. Moreover, since the steam GW is supplied to the space S2, dissolution of the gas GD in the liquid LQ is accelerated, and charging of the liquid LQ can be suppressed more effectively. Furthermore, since vaporization of the liquid LQ in the vicinity of the interface LG2 of the liquid LQ is suppressed, it is possible to suppress a change in the temperature of the liquid LQ, the terminating optical element 22, and the liquid immersion member 4B.

In the second embodiment, although the gas supply port 37B and the air supply port 55B are disposed in the concave portion 53, one of them may be disposed in the concave portion 53, and the other may be disposed on the inner side surface 32A on the outer side of the concave portion 53.

Moreover, the concave portion 53 may not be provided, and the gas supply port 37B and the air supply port 55B may be disposed on the inner side surface 32A. Moreover, the concave portion 54 may not be provided, and the gas recovery port 39B may be disposed on the inner side surface 32A.

Furthermore, in the second embodiment, at least one of the gas supply port 37B, the gas recovery port 39B, and the air supply port 55B may be provided on the upper surface 32B of the liquid immersion member 4B.

Third Embodiment

Next, the third embodiment will be described. In the following description, constituent elements which are the same as or similar to those of the above embodiments will be denoted by the same reference numerals, and description thereof will be simplified or omitted.

Figure 5:
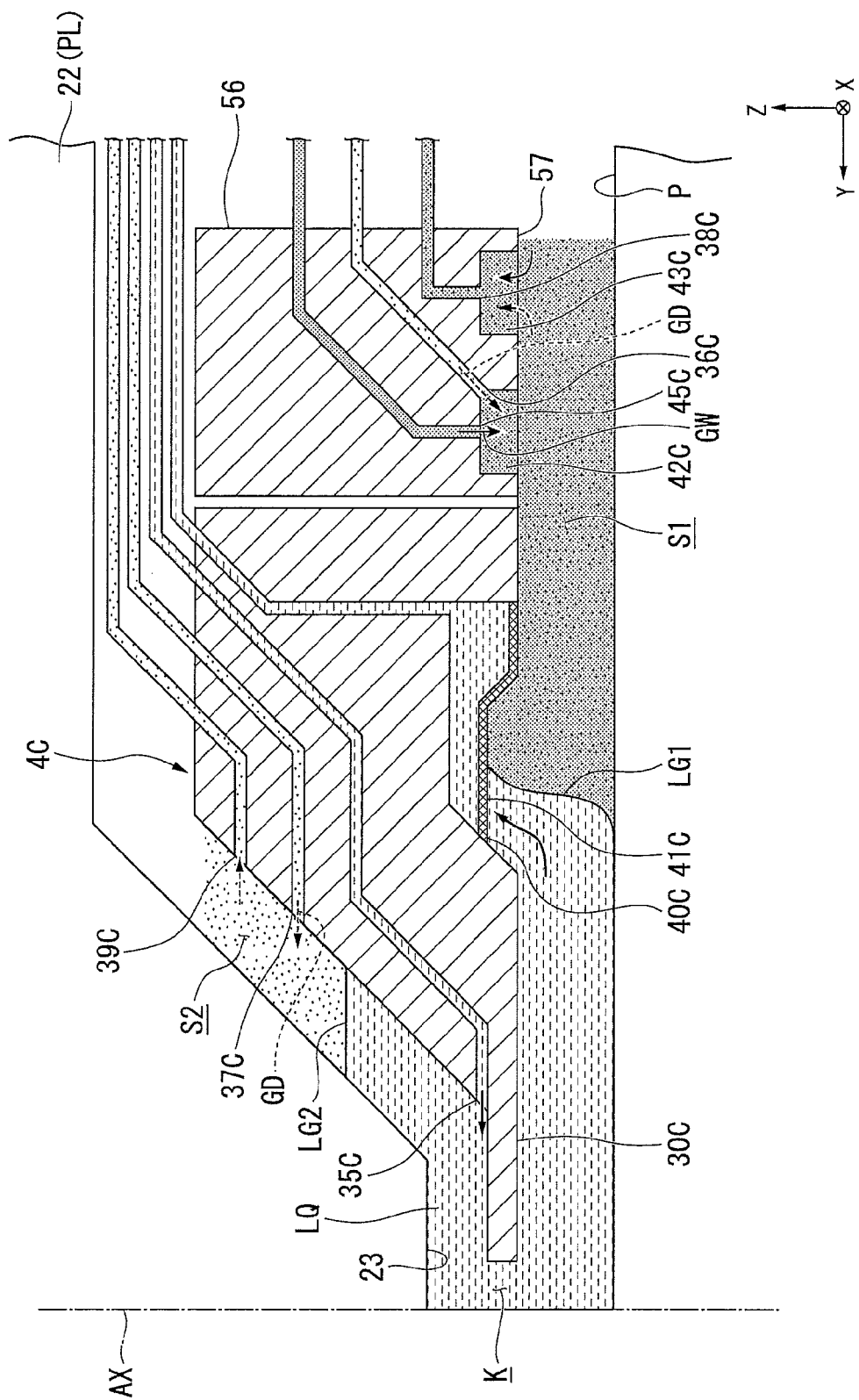
FIG. 5 is a cross-sectional view showing the vicinity of the liquid immersion member according to a third embodiment.

FIG. 5 is a view showing an example of a liquid immersion member 4C according to the third embodiment. The third embodiment is a modified example of the first embodiment. The characteristic part of the third embodiment different from the first embodiment described above is that a gas supply port 36C, an air supply port 45C, and a gas recovery port 38C are disposed in at least a part of the circumference of the optical path K of the exposure light EL and on a holding member 56 disposed on the outer side of the liquid immersion member 4C in the radiation direction in relation to the optical axis AX.

In the present embodiment, the holding member 56 is an annular member disposed around the liquid immersion member 4C. The holding member 56 includes a lower surface 57 which is configured to face the surface of the substrate P. In the present embodiment, at least some of the gas GD supplied from the gas supply port 36C is held between the lower surface 57 of the holding member 56 and the surface of the substrate P.

In the present embodiment, a liquid supply port 35C for supplying the liquid LQ in order to fill the optical path K of the exposure light EL with the liquid LQ, a liquid recovery port 40C (a porous member 41C) for recovering the liquid LQ, a gas supply port 37C for supplying the gas GD to the space S2, and a gas recovery port 39C for recovering the gas GD in the space S2 are disposed in the liquid immersion member 4C.

In the present embodiment, a gas supply port 36C for supplying the gas GD to the space S1, an air supply port 45C for supplying the steam GW to the space S1, and a gas recovery port 38C for recovering the gas GD and the steam GW in the space S1 are disposed on the lower surface 57 of the holding member 56. The gas supply port 36C and the air supply port 45C are disposed on the inner surface of a concave portion 42C formed on the lower surface 57, and the gas recovery port 38C is disposed on the inner surface of a concave portion 43C formed on the lower surface 57. In the present embodiment, the space S1 is a space between at least a part of the lower surface 30C of the liquid immersion member 4C and the lower surface 57 of the holding member 56, and the surface of the substrate P.

In the present embodiment, it is possible to suppress charging of the liquid LQ and the like and to suppress the occurrence of exposure defects.

In the present embodiment, the gas supply port 36C and the air supply port 45C may be disposed in the liquid immersion member 4C, and the gas recovery port 38C may be disposed on the holding member 56. That is, some of the gas supply port 36C, the air supply port 45C, and the gas recovery port 38C may be disposed on the holding member 56, and the remaining ports may be disposed in the liquid immersion member 4C. Moreover, some of the gas supply port 36C, the air supply port 45C, and the gas recovery port 38C may be disposed on still another member.

Moreover, in the third embodiment, one of the gas supply port 36C and the air supply port 45C may be disposed in the concave portion 42C, and the other may be disposed on the lower surface 57 of the holding member 56. The concave portion 42C may not be provided, and both the gas supply port 36C and the air supply port 45C may be provided on the lower surface 57. Moreover, in the third embodiment, the concave portion 43C may not be provided, and the gas recovery port 38C may be provided on the lower surface 57. Furthermore, in the third embodiment, the humidified gas GD may be supplied from the gas supply port 36C, and the air supply port 45C may be omitted. In the third embodiment, the steam of the liquid LQ may be supplied to the space S2, and the humidified gas GD may be supplied from the gas supply port 37C.

In the first to third embodiments described above, although a case where the steam GW humidifies the gas GD by the steam of the liquid LQ has been described as an example, the gas GD may be humidified by the steam of liquid different from the liquid LQ.

Moreover, in the first to third embodiments described above, although the gas GD supplied to the space S1 from the gas supply port is the same as the gas GD supplied to the space S2 from the gas supply port, they may be different from each other. For example, the gas GD supplied to the space S1 may include carbon dioxide as the material that changes the specific resistance of the liquid LQ, and the gas GD supplied to the space S2 may include hydrogen as the material that changes the specific resistance of the liquid LQ. Alternatively, the concentration (proportion) of the material that changes the specific resistance of the liquid LQ may be different between that in the gas GD supplied to the space S1 and that in the gas GD supplied to the space S2.

Furthermore, in the first to third embodiments described above, the gas including the material that changes the specific resistance of the liquid LQ may be supplied to any one of the spaces S1 and S2. Moreover, in the first to third embodiments described above, although at least a part of the space S1 is humidified by supplying the steam GW from the air supply port and/or supplying the humidified gas GD from the gas supply port, the space S1 may not be humidified. Furthermore, in the first to third embodiments described above, at least one of the gas recovery port for recovering the gas from the space S1 and the gas recovery port for recovering the gas from the space S2 may be omitted.

Fourth Embodiment

Next, the fourth embodiment will be described. In the following description, constituent elements which are the same as or similar to those of the above embodiments will be denoted by the same reference numerals, and description thereof will be simplified or omitted.

Figure 6:
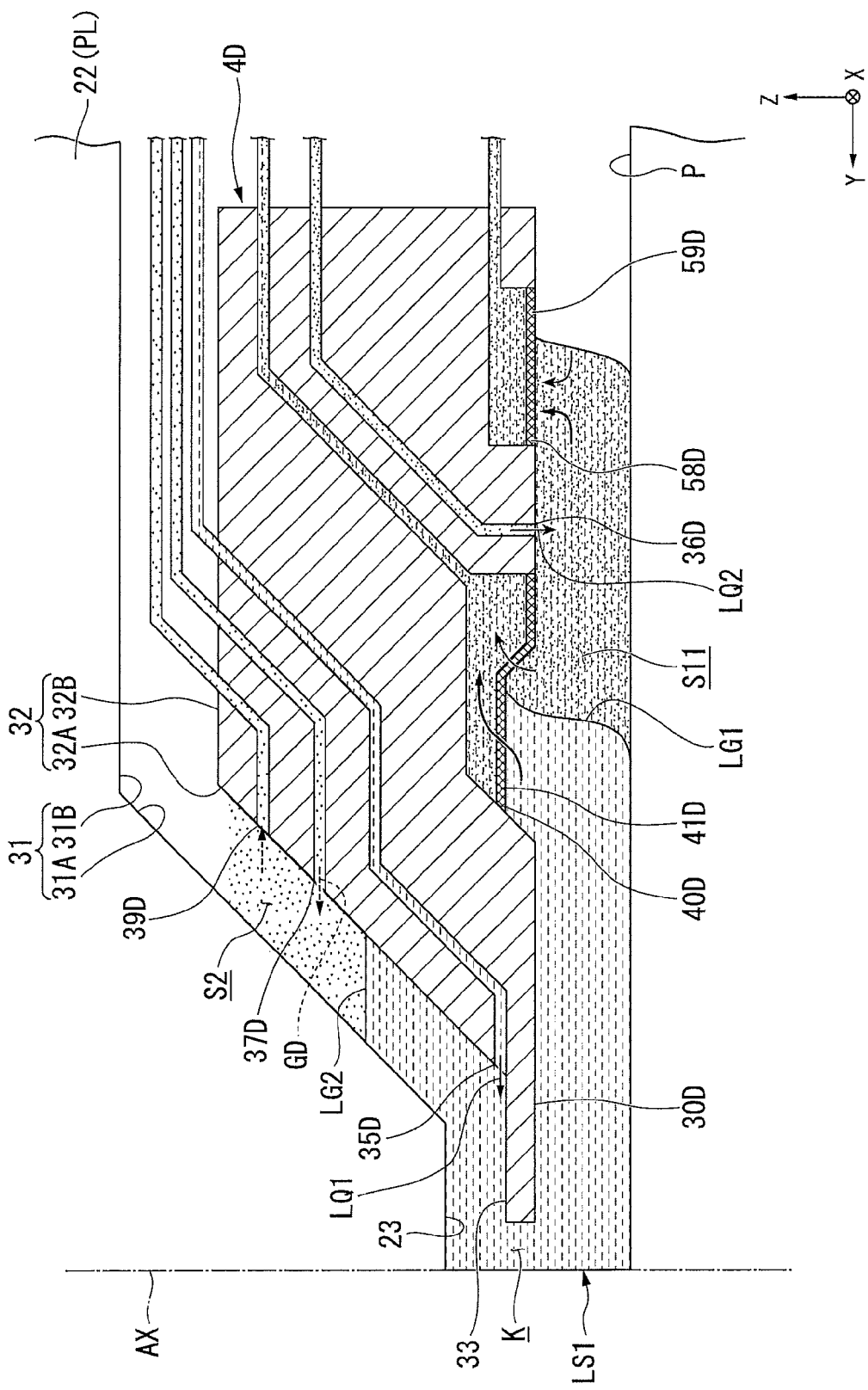
FIG. 6 is a cross-sectional view showing the vicinity of the liquid immersion member according to a fourth embodiment.

FIG. 6 is a view showing an example of a liquid immersion member 4D according to the fourth embodiment. In FIG. 6, the liquid immersion member 4D includes a first supply port 35D for supplying a first liquid LQ1 in order to fill the optical path K of the exposure light EL emitted from the emission surface 23 with the first liquid LQ1 having a first specific resistance and a second supply port 36D for supplying a second liquid LQ2 having a specific resistance different from the first liquid LQ1 to at least a part of a space S11 around a liquid immersion space LS1 formed by the first liquid LQ1. In the present embodiment, the second liquid LQ2 has a specific resistance lower than the first liquid LQ1.

Similarly to the liquid immersion member 4 of the first embodiment described above, the liquid immersion member 4D according to the present embodiment is disposed in at least a part of the circumference of the optical path K. A part of the liquid immersion space LS1 is formed between the substrate P facing the lower surface 30D of the liquid immersion member 4D and the lower surface 30D of the liquid immersion member 4D.

The first supply port 35D supplies the first liquid LQ1 to the space between the emission surface 23 and the upper surface 33. In the present embodiment, the first liquid LQ1 is water (pure water).

The second supply port 36D is disposed on the lower surface 30D of the liquid immersion member 4D. The second supply port 36D supplies the second liquid LQ2 to the space S11. In the present embodiment, the second liquid LQ2 includes the first liquid LQ1. That is, the main component of the second liquid LQ2 is the first liquid LQ1 (water).

In the present embodiment, the second liquid LQ2 is formed by dissolving (adding) a material that decreases the specific resistance of the first liquid LQ1 in the first liquid LQ1. In the present embodiment, the material is carbon dioxide. That is, the second liquid LQ2 is carbonated water which is formed by dissolving carbon dioxide in the first liquid LQ1 (water).

The second liquid LQ2 may include ozone or hydrogen. That is, the second liquid LQ2 may be ozone water in which ozone is dissolved in water and may be hydrogen water in which hydrogen is dissolved in water. The ozone water or the hydrogen water can decrease the specific resistance of the first liquid LQ1.

Moreover, the liquid immersion member 4D includes a first recovery port 40D that is disposed on the lower surface 30D so as to recover at least some of the first liquid LQ1 on the substrate P. A porous member 41D is disposed in the first recovery port 40D. The first recovery port 40D of the liquid immersion member 4D has approximately the same configuration as the liquid recovery port 40 of the liquid immersion member 4 of the first embodiment described above, and detailed description thereof will be omitted.

The second supply port 36D is disposed on the outer side of the first recovery port 40D in the radiation direction in relation to the optical axis AX. In the present embodiment, the shape of the second supply port 36D within the XY plane is annular. The second supply port 36D is disposed so as to surround the first recovery port 40D. In addition, a plurality of second supply ports 36D may be disposed on the lower surface 30D around the optical path K at predetermined intervals.

Moreover, the liquid immersion member 4D includes a second recovery port 58D that is disposed on the lower surface 30D so as to recover at least some of the second liquid LQ2 on the substrate P. The second recovery port 58D is disposed on the outer side of the second supply port 36D in the radiation direction in relation to the optical axis AX. A porous member 59D is disposed in the second recovery port 58D. Similarly to the first recovery port 40D, the second recovery port 58D recovers only liquid through the openings or pores of the porous member 59 but does not recover gas.

Moreover, the liquid immersion member 4D includes a gas supply port 37D which is disposed on the inner side surface 32A so as to be capable of supplying gas GD including a material capable of changing the specific resistance of the first liquid LQ1 to the space S2 between the terminating optical element 22 and the liquid immersion member 4D and a gas recovery port 39D capable of recovering the gas GD in the space S2. The gas supply port 37D and the gas recovery port 39D of the liquid immersion member 4D have approximately the same configurations as the gas supply port 37 and the gas recovery port 39D of the liquid immersion member 4 of the first embodiment described above, and detailed description thereof will be omitted.

Next, a method of exposing the substrate P using the exposure apparatus EX having the configuration described above will be described.

The control device 7 performs the operation of supplying the first liquid LQ1 by the first supply port 35D and the operation of recovering liquid by the first recovery port 40D in a state where the emission surface 23 and the lower surface 30D face the surface of the substrate P. The first supply port 35D supplies the first liquid LQ1 to the optical path K of the exposure light EL. At least some of the first liquid LQ1 between the lower surface 30D and the surface of the substrate P is recovered through the first recovery port 40D. A liquid immersion space LS1 is formed by the first liquid LQ1 supplied from the first supply port 35D so that the optical path K of the exposure light EL between the emission surface 23 and the surface of the substrate P is filled with the first liquid LQ1.

Moreover, the control device 7 performs the operation of supplying the gas GD to the space S2 by the gas supply port 37D and the operation of recovering the gas GD in the space S2 by the gas recovery port 39D. In this way, the space S2 is filled with the gas GD, and the gas GD comes into contact with the interface LG2 of the first liquid LQ1.

Moreover, the control device 7 performs the operation of supplying the second liquid LQ2 to the space S11 by the second supply port 36D and performs the operation of recovering the second liquid LQ2 in the space S11 by the second recovery port 58D. At least some of the second liquid LQ2 supplied to the space S11 through the second supply port 36D is recovered through the first recovery port 40D. Moreover, at least some of the second liquid LQ2 supplied to the space S11 through the second supply port 36D is recovered through the second recovery port 58D. That is, in the present embodiment, the first recovery port 40D recovers the first and second liquid LQ1 and LQ2 on the substrate P, and the second recovery port 58D mainly recovers the second liquid LQ2 on the substrate P.

In this way, the space S11 is filled with the second liquid LQ2, and the second liquid LQ2 supplied to the space S11 through the second supply port 36D comes into contact with the interface LG1 of the first liquid LQ1 in the liquid immersion space LS1.

The control device 7 starts exposure of the substrate P in a state where the liquid immersion space LS1 is formed. The control device 7 exposes the substrate P with the exposure light EL from the emission surface 23 via the first liquid LQ1 between the emission surface 23 and the surface of the substrate P.

During exposure of the substrate P, the operation of supplying the first liquid LQ1 by the first supply port 35D, the operation of supplying the second liquid LQ2 by the second supply port 36D, the operation of recovering the first and second liquid LQ1 and LQ2 by the first recovery port 40D, the operation of recovering the second liquid LQ2 by the second recovery port 58D, the operation of supplying the gas GD by the gas supply port 37D, and the operation of recovering the gas GD by the gas recovery port 39D are executed concurrently.

In the present embodiment, the space S1 around the liquid immersion space LS1 formed by the first liquid LQ1 is filled with the second liquid LQ2 having a low specific resistance, and the space S11 filled with the second liquid LQ2 suppress the first liquid LQ1 in the liquid immersion space LS1 from coming into contact with the gas (air in the present embodiment) in the inner space 8 controlled by the chamber device 5.

In the present embodiment, since the second liquid LQ2 which has a lower specific resistance than the first liquid LQ1 and which is mixed with the first liquid LQ1 in the vicinity of the interface LG1 and is capable of decreasing the specific resistance of the first liquid LQ1 in the vicinity of the interface LG1 is supplied to the space S11, charging of the first liquid LQ1 is suppressed. Moreover, charging of the liquid immersion member 4 contacting the first liquid LQ1, charging of the substrate P, and charging of the substrate stage 2 (the plate member T) are suppressed.

Fifth Embodiment

Next, the fifth embodiment will be described. In the following description, constituent elements which are the same as or similar to those of the above embodiments will be denoted by the same reference numerals, and description thereof will be simplified or omitted.

Figure 7:
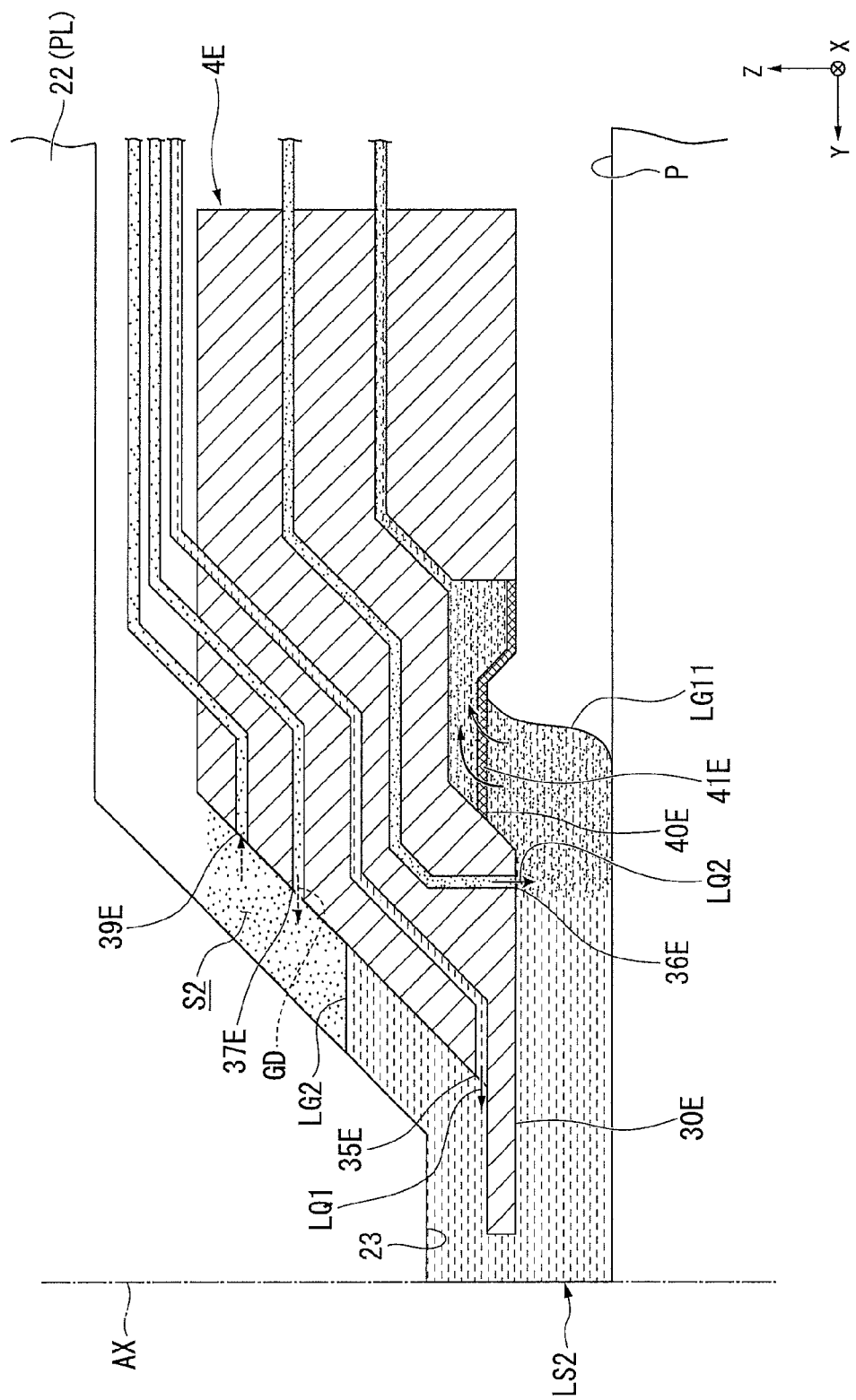
FIG. 7 is a cross-sectional view showing the vicinity of the liquid immersion member according to a fifth embodiment.

FIG. 7 is a view showing an example of a liquid immersion member 4E according to the fifth embodiment. The liquid immersion member 4E according to the fifth embodiment is a modified example of the liquid immersion member 4D according to the fourth embodiment. The characteristic part of the liquid immersion member 4E according to the fifth embodiment different from the liquid immersion member 4D according to the fourth embodiment is that a second supply port 36E for supplying the second liquid LQ2 is disposed on the inner side of a first recovery port 40E in the radiation direction in relation to the optical axis AX. Moreover, in the liquid immersion member 4E of the present embodiment, the second recovery port (58D) is not provided.

In the present embodiment, the second supply port 36E is disposed on the lower surface 30E of the liquid immersion member 4E around the optical path K. That is, the shape of the second supply port 36E is annular. In addition, a plurality of second supply ports 36E may be disposed on the lower surface 30E around the optical path K at predetermined intervals.

Moreover, the liquid immersion member 4E includes a gas supply port 37E for supplying the gas GD to the space S2 and a gas recovery port 39E for recovering the gas GD in the space S2. The gas supply port 37E and the gas recovery port 39E of the liquid immersion member 4E have approximately the same configurations as the gas supply port 37 and the gas recovery port 39D of the liquid immersion member 4 of the first embodiment described above, and detailed description thereof will be omitted.

In the present embodiment, the optical path K is formed by the first liquid LQ1, and the periphery of a liquid immersion space LS2 including an interface LG11 between the liquid immersion member 4E and the substrate P is formed by the first liquid LQ1 from the first supply port 35E and the second liquid LQ2 from the second supply port 36E. The first recovery port 40E recovers both the first liquid LQ1 and the second liquid LQ2 through a porous member 41E.

In the present embodiment, since the second liquid LQ2 having a lower specific resistance than the first liquid LQ1 is supplied in the vicinity of the interface LG11, it is possible to effectively suppress charging of the liquid in the liquid immersion space LS in the vicinity of the interface LG11.

In the present embodiment, a second recovery port disposed to be separated from the first recovery port 40E may be provided on the lower surface 30E of the liquid immersion member 4E on the outer side of the first recovery port 40E in the radiation direction in relation to the optical axis AX.

Moreover, in the present embodiment, an air supply port for supplying the steam of the second liquid LQ2 may be provided on the outer side of the first recovery port 40E in the radiation direction in relation to the optical axis AX, and similarly to the first to third embodiments described above, a space having higher humidity than the inner space 8 may be formed in at least a part of the circumference of the liquid immersion space LS2.

Sixth Embodiment

Next, the sixth embodiment will be described. In the following description, constituent elements which are the same as or similar to those of the above embodiments will be denoted by the same reference numerals, and description thereof will be simplified or omitted.

Figure 8:
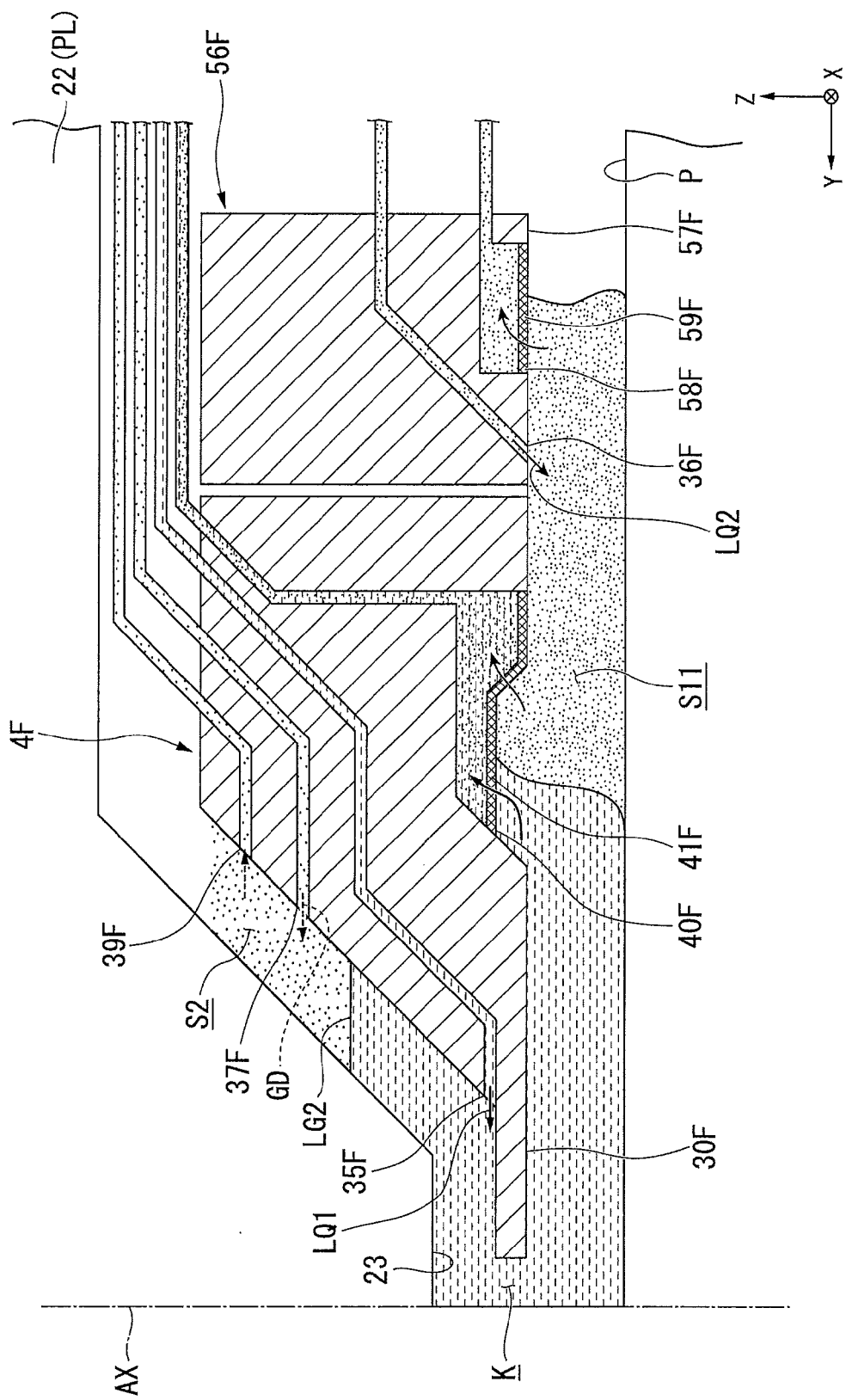
FIG. 8 is a cross-sectional view showing the vicinity of the liquid immersion member according to a sixth embodiment.

FIG. 8 is a view showing an example of a liquid immersion member 4F according to the sixth embodiment. The sixth embodiment is a modified example of the fourth embodiment. The characteristic part of the sixth embodiment different from the fourth embodiment is that a second supply port 36F and a second recovery port 58F (a porous member 59F) are disposed in at least a part of the circumference of the optical path K of the exposure light EL and on a holding member 56F disposed on the outer side of the liquid immersion member 4F in the radiation direction in relation to the optical axis AX.

In the present embodiment, the holding member 56F is an annular member disposed around the liquid immersion member 4F. The holding member 56F includes a lower surface 57F which is configured to face the surface of the substrate P. In the present embodiment, at least some of the second liquid LQ2 is held between the lower surface 57F of the holding member 56F and the surface of the substrate P.

In the present embodiment, a first supply port 35F for supplying the first liquid LQ1 to the optical path K, a first recovery port 40F in which the porous member 41F is disposed and which recovers the liquid on the substrate P, a gas supply port 37F for supplying the gas GD to the space S2, and a gas recovery port 39F for recovering the gas GD in the space S2 are disposed in the liquid immersion member 4F.

In the present embodiment, a second supply port 36F for supplying the second liquid LQ2 to the space S11 and a second recovery port 58F for recovering at least some of the second liquid LQ2 are disposed on the lower surface 57F of the holding member 56F. The second recovery port 58F recovers the second liquid LQ2 through a porous member 59F. The second recovery port 58F is disposed on the outer side of the second supply port 36F in the radiation direction in relation to the optical axis AX. The second recovery port 58F mainly recovers the second liquid LQ2 from the second supply port 36F, and the first recovery port 40F recovers the first liquid LQ1 from the first supply port 35F and the second liquid LQ2 from the second supply port 36F.

In the present embodiment, it is possible to suppress charging of the first liquid LQ1 and the like and to suppress the occurrence of exposure defects.

In the present embodiment, the second supply port 36F may be disposed on the holding member 56F, and the second recovery port 58F may be disposed on a member different from the liquid immersion member 4F and the holding member 56F.

Seventh Embodiment

Next, the seventh embodiment will be described. In the following description, constituent elements which are the same as or similar to those of the above embodiments will be denoted by the same reference numerals, and description thereof will be simplified or omitted.

Figure 9:
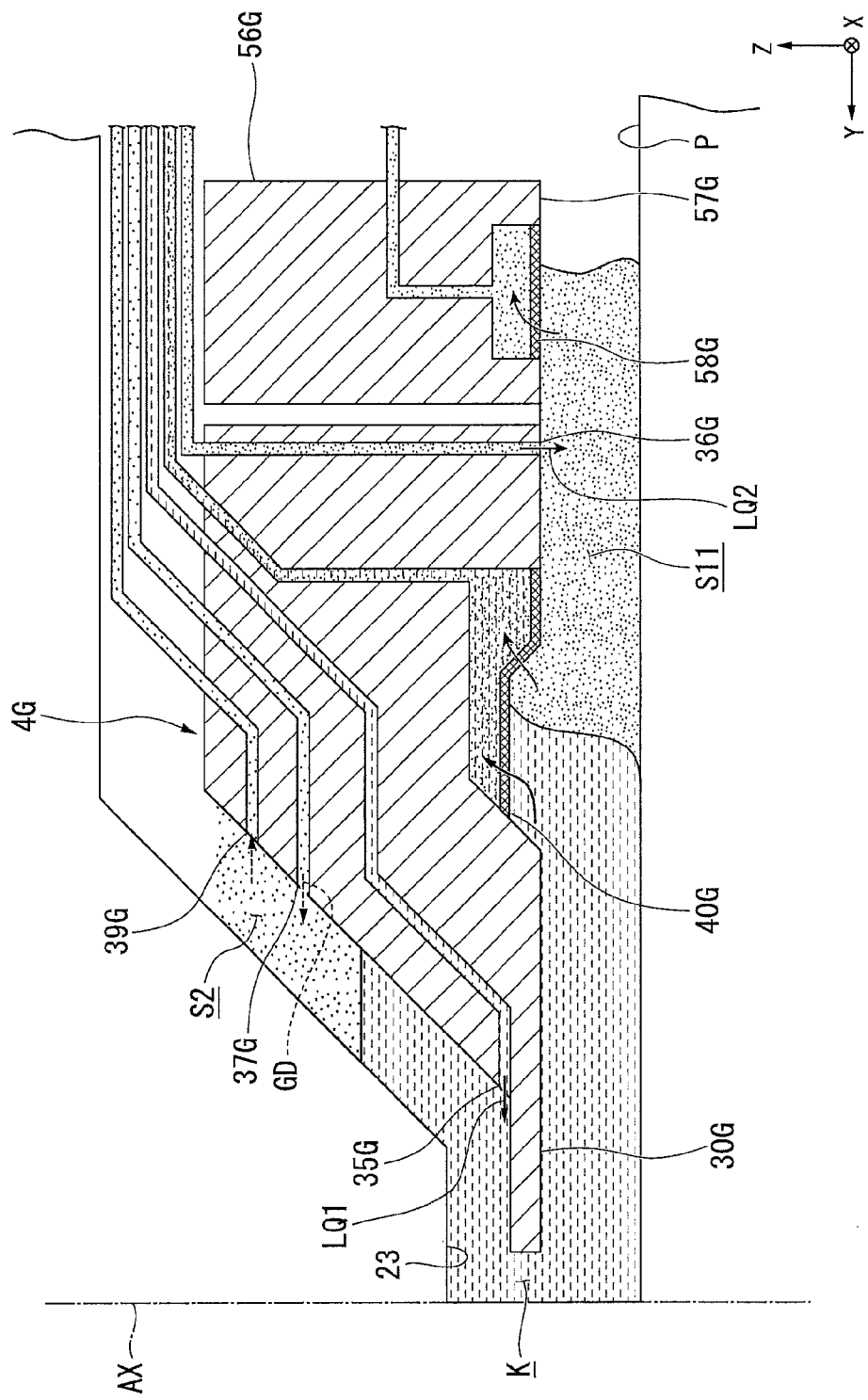
FIG. 9 is a cross-sectional view showing the vicinity of the liquid immersion member according to a seventh embodiment.

FIG. 9 is a view showing an example of a liquid immersion member 4G according to the seventh embodiment. The seventh embodiment is a modified example of the sixth embodiment.

As shown in FIG. 9, a second supply port 36G for supplying the second liquid LQ2 to the space S11 is provided on the lower surface 30G of the liquid immersion member 4G. Moreover, the liquid immersion member 4G includes a first supply port 35G for supplying the first liquid LQ1 to the optical path K, a gas supply port 37G for supplying the gas GD to the space S2, a gas recovery port 39G for recovering the gas GD in the space S2, and a first recovery port 40G for recovering the liquid on the substrate P.

In the present embodiment, a second recovery port 58G for recovering at least some of the second liquid LQ2 is provided on the lower surface 57G of the holding member 56G.

In the present embodiment, it is possible to suppress charging of the first liquid LQ1 and the like and to suppress the occurrence of exposure defects.

In the fourth to seventh embodiments described above, although a case where the second liquid LQ2 is formed by dissolving the material that decreases the specific resistance of the first liquid LQ1 in the first liquid LQ1 has been described as an example, the second liquid LQ2 may be formed by dissolving the material in a liquid different from the first liquid LQ1. That is, the main component of the first liquid LQ1 may be different from the main component of the second liquid LQ2.

Moreover, in the fourth to seventh embodiments described above, the material that decreases the specific resistance of the first liquid LQ1 included in the second liquid LQ2 may be different from the material that decreases the specific resistance of the first liquid LQ1 included in the gas GD supplied to the space S2.

Moreover, in the fourth to seventh embodiments described above, the gas recovery port (39D, 39E, 39F, or 39G) for recovering the gas from the space S2 may be provided on the upper surface 32 of the liquid immersion member (4D, 4E, 4F, or 4G), and the gas recovery port (39D, 39E, 39F, or 39G) may not be provided.

Moreover, in the fourth to seventh embodiments described above, the steam of the first liquid LQ1 may be supplied to the space S2, and the gas GD humidified by the steam of the first liquid LQ1 may be supplied to the space S2.

Moreover, in the fourth to seventh embodiments described above, the gas supply port (37D, 37E, 37F, or 37G) for supplying the gas GD to the space S2 and the gas recovery port (39D, 39E, 39F, or 39G) for recovering the gas from the space S2 may be omitted.

Moreover, in the fourth, sixth and seventh embodiments described above, an air supply port for supplying the steam of the second liquid LQ2 may be provided on the outer side of the second recovery port (58D, 58F, or 58G) in the radiation direction in relation to the optical axis AX, and similarly to the first to third embodiments described above, a space of which the humidity is higher than the inner space 8 may be formed in at least a part of the circumference of the space S11.

Moreover, in the fourth, sixth, and seventh embodiments described above, although the difference between the pressure of the upper surface-side space of the porous member (59D, 59F, or 59G) and the pressure of the lower surface-side space is adjusted so that the second recovery port (58D, 58F, or 58G) recovers only liquid, the second recovery port (58D, 58F, or 58G) may recover liquid together with gas. In this case, the porous member (59D, 59F, or 59G) may be omitted.

Moreover, in the fourth, sixth, and seventh embodiments described above, the second recovery port (the porous member) may be disposed on the lower side than the first recovery port (the porous member).

Moreover, in the first to seventh embodiments described above, although the first recovery port (40 or the like) recovers only liquid, the first recovery port may recover liquid together with gas. In this case, the porous member (41 or the like) of the first recovery port (40 or the like) may be omitted.

Moreover, in the first to seventh embodiments described above, the liquid immersion member (4 or the like) may be movable relative to the terminating optical element 22 in parallel to at least one of the X, Y, and Z axes and may be rotatable about the X, Y, and Z axes.

Moreover, in the first to seventh embodiments described above, the plate portion 41 of the liquid immersion member may be omitted. For example, the lower surface (30 or the like) of the liquid immersion member may be provided in at least a part of the circumference of the emission surface 23. In this case, the lower surface (30 or the like) of the liquid immersion member may be disposed at the same height as the emission surface 23 or on the upper side (+Z side) than the emission surface 23.

Moreover, in the first to seventh embodiments described above, although the optical path on the emission side (image plane side) of the terminating optical element 22 of the projection optical system PL is filled with the liquid LQ (the first liquid LQ1), a projection optical system in which the optical path on the incidence side (object plane side) of the terminating optical element 22 is also filled with liquid may be employed as disclosed in the pamphlet of PCT International Publication No. 2004/019128, for example. The liquid filled in the incidence-side optical path of the terminating optical element 22 may be the same kind of liquid as the liquid LQ (the first liquid LQ1) and may be a different kind of liquid from the liquid LQ (the first liquid LQ1).

Although the liquid LQ (the first liquid LQ1) of the respective embodiments described above is water, it may be liquid other than water. For example, hydrofluoroether (HFE), perfluorinated polyether (PFPE), fomblin oil, or the like can be used as the liquid LQ (the first liquid LQ1). Moreover, various liquids, for example a supercritical liquid, can be used as the liquid LQ.

Furthermore, the substrate P of the respective embodiments described above may be not only a semiconductor wafer for manufacturing semiconductor devices but also a glass substrate for display devices, a ceramic wafer for thin-film magnetic heads, or the raw plate (synthetic quartz or a silicon wafer) of a mask or a reticle that is used by an exposure apparatus.

As for the exposure apparatus EX, a step-and-scan type scanning exposure apparatus (a scanning stepper) that scans and exposes the pattern of the mask M by synchronously moving the mask M and the substrate P, and a step-and-repeat type projection exposure apparatus (a stepper) that performs exposure of the pattern of the mask M in a batch with the mask M and the substrate P in a stationary state and then sequentially moves the substrate P in a stepwise manner can be used.

Furthermore, the step-and-repeat type exposure may be performed in a batch such that after a reduced image of a first pattern is transferred to the substrate P using the projection optical system in a state where the first pattern and the substrate P are substantially stationary, a reduced image of a second pattern is transferred to the substrate P so as to be partially superimposed on the first pattern using the projection optical system in a state where the second pattern and the substrate P are substantially stationary (a stitch type batch exposure apparatus). In addition, a step-and-stitch type exposure apparatus in which at least two patterns are transferred to the substrate P in a partially superimposed manner, and the substrate P is sequentially moved can be used as the stitch type exposure apparatus.

Moreover, as disclosed in U.S. Pat. No. 6,611,316, for example, the present invention can also be applied to an exposure apparatus that combines the patterns of two masks on a substrate through a projection optical system and double exposes, substantially simultaneously, a single shot region on the substrate using a single scanning exposure. Furthermore, the present invention can also be applied to a proximity type exposure apparatus, a mirror projection aligner, or the like.

Moreover, the present invention can also be adapted to a twin stage type exposure apparatus that includes a plurality of substrate stages, as disclosed in the specifications of U.S. Pat. Nos. 6,341,007, 6,208,407, and 6,262,796, for example.

In addition, the present invention can also be applied to an exposure apparatus that includes a substrate stage which holds a substrate and a measurement stage on which a reference member having a reference mark formed thereon and/or various photoelectric sensors are mounted, and which does not hold an exposure target substrate, as disclosed in the specification of U.S. Pat. No. 6,897,963 and the specification of US Patent Application Publication No. 2007/0127006, for example. Moreover, the present invention can also be applied to an exposure apparatus that includes a plurality of substrate stages and a plurality of measurement stages.

The type of exposure apparatus EX is not limited to an exposure apparatus for manufacturing semiconductor devices that exposes the pattern of a semiconductor device on the substrate P, but can be widely applied to exposure apparatuses used for manufacturing liquid crystal display devices or displays and exposure apparatuses used for manufacturing thin-film magnetic heads, image capturing devices (CCDs), micromachines (MEMS), DNA chips, or reticles and masks, for example.

Moreover, in the respective embodiments described above, an ArF excimer laser may be used as a light source apparatus that generates ArF excimer laser light as the exposure light EL. However, as disclosed in U.S. Pat. No. 7,023,610, for example, a harmonic generation device which includes a solid-state laser light source such as a DFB semiconductor laser or a fiber laser, an optical amplifier part including a fiber amplifier and the like, and a wavelength converter, and which outputs pulsed light with a wavelength of 193 nm may be used. Furthermore, in the above embodiments, although the illumination regions and projection regions described above have a rectangular shape, they may have a different shape, for example, a circular arc shape.

Furthermore, in the respective embodiments described above, a transmitting mask in which a predetermined shielding pattern (or a phase pattern or a dimming pattern) is formed on a transmissive substrate has been used. However, instead of this mask, as disclosed in the specification of U.S. Pat. No. 6,778,257, for example, a variable form mask (also referred to as an electronic mask, an active mask, or an image generator) that forms a transmission pattern, a reflection pattern, or a light emitting pattern based on electronic data of the pattern to be exposed may be used. The variable form mask includes a digital micro-mirror device (DMD), which is one kind of non-emission type image display device (spatial light modulator), for example. In addition, instead of a variable form mask that includes a non-emission type image display device, a pattern forming apparatus that includes a self-emission image display device may be provided. Examples of the self-emission type image display device include a cathode ray tube (CRT), an inorganic EL display, an organic EL display (OLED: organic light emitting diode), an LED display, an LD display, a field emission display (FED), and a plasma display (PDP: plasma display panel).

In the respective embodiments described above, although the exposure apparatus that includes the projection optical system PL has been described as an example, the present invention can be applied to an exposure apparatus and an exposure method which do not use the projection optical system PL. As above, even when the projection optical system PL is not used, the exposure light is irradiated onto the substrate through optical members such as lenses, and a liquid immersion space is formed in a predetermined space between these optical members and the substrate.

Furthermore, as disclosed in the pamphlet of PCT International Publication No. 2001/035168, for example, the present invention can be also applied to an exposure apparatus (a lithography system) that exposes the substrate P with a line-and-space pattern by forming interference fringes on the substrate P.

As described above, the exposure apparatus EX of the present embodiment is manufactured by assembling various subsystems including the respective constituent elements mentioned in the claims of the present application so that predetermined mechanical, electrical, and optical accuracies are maintained. To ensure these various accuracies, adjustments are performed before and after this assembly, including an adjustment for achieving optical accuracy for various optical systems, an adjustment for achieving mechanical accuracy for various mechanical systems, and an adjustment for achieving electrical accuracy for various electrical systems. The process of assembling various subsystems into the exposure apparatus includes, for example, the mechanical interconnection of various subsystems, the wiring and connection of the circuits, and the piping and connection of the atmospheric pressure circuit. Naturally, prior to performing the process of assembling various subsystems into the exposure apparatus, the processes of assembling individual subsystems are performed. When the process of assembling various subsystems into the exposure apparatus is completed, comprehensive adjustments are performed, whereby various accuracies of the exposure apparatus as a whole are secured. Furthermore, it is preferable to manufacture the exposure apparatus in a clean room where the temperature, the cleanliness level, and the like are controlled.

Figure 10:
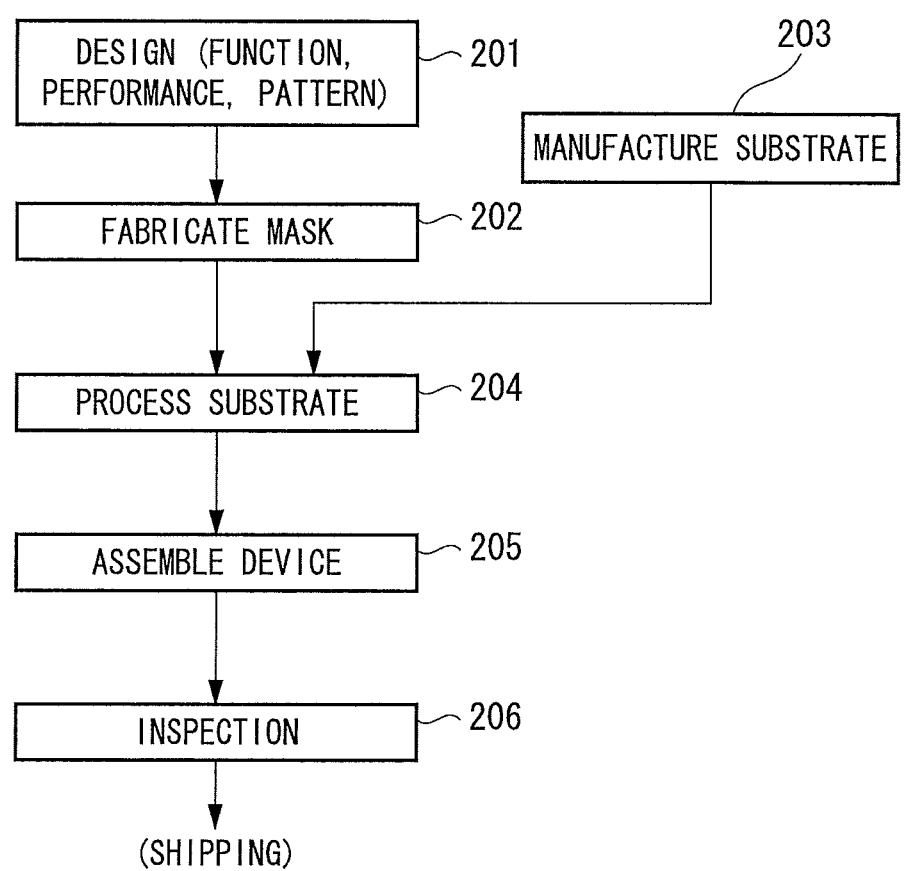
FIG. 10 is a flowchart illustrating an example of the processes of manufacturing microdevices.

As shown in FIG. 10, a microdevice such as a semiconductor device is manufactured through: a step 201 of designing the functions and performance of the microdevice; a step 202 of fabricating a mask (a reticle) based on this designing step; a step 203 of manufacturing a substrate which is the base material of the device; a substrate processing step 204 including exposing the substrate with exposure light using the pattern of the mask in accordance with the embodiments described above and developing the exposed substrate; a device assembling step 205 (including a processing process such as a dicing process, a bonding process, and a packaging process); an inspecting step 206; and the like.

Furthermore, the requirements of the respective embodiments may be appropriately combined with each other. Moreover, some constituent elements may not be used. As far as is permitted by the law, the disclosures in all of the patent application Publications and US patents related to exposure apparatuses and the like cited in the above respective embodiments and modified examples, are incorporated herein by reference.

What is claimed is:

1. An exposure apparatus that exposes a substrate with exposure light via a liquid, the exposure apparatus comprising:
- an optical system having a terminating optical element that emits the exposure light into an optical path;
- a substrate stage having a holder by which the substrate is held, which is movable relative to and below the optical system; and
- a liquid immersion member having an opening through which exposure light is projected, a liquid supply port via which the liquid is supplied to fill the optical path of the exposure light with the liquid, a liquid recovery port, and a fluid supply port that supplies carbon dioxide gas to a gas space, the gas space at least partly surrounding the optical path, the gas space being formed between the liquid immersion member on one side and an upper surface of the substrate and/or an upper surface of the substrate stage on the other side, the carbon dioxide gas being supplied from the fluid supply port in gas phase without liquid, wherein:
the liquid recovery port is disposed such that the upper surface of the substrate faces the liquid recovery port, and
the fluid supply port is disposed radially outward of the liquid recovery port in a radial direction in relation to an optical axis of the optical system.

2. The exposure apparatus according to claim 1, further comprising a fluid recovery port.

3. The exposure apparatus according to claim 2, wherein the fluid recovery port is disposed radially outward of the fluid supply port in a radial direction in relation to the optical axis of the optical system.

4. The exposure apparatus according to claim 3, wherein the fluid supply port is disposed between the liquid recovery port and the fluid recovery port in a radial direction in relation to the optical axis of the optical system to recover the carbon dioxide gas.

5. The exposure apparatus according to claim 3, wherein the liquid immersion member has the fluid supply port, and
the fluid supply port and the fluid recovery port face the gas space, the gas space being substantially filled with gas.

6. The exposure apparatus according to claim 3, wherein the fluid supply port and the fluid recovery port face the upper surface of the substrate during exposure of the substrate.

7. The exposure apparatus according to claim 1, wherein the liquid is supplied from the liquid supply port and the liquid is recovered from the liquid recovery port to form a liquid immersion space such that at least a part of the liquid immersion space is formed between the liquid immersion member on the one side and the upper surface of the substrate and/or the upper surface of the substrate stage on the other side.

8. The exposure apparatus according to claim 7, further comprising
an outer member that is disposed radially outward of the optical path and radially outward of the liquid immersion member in a radial direction in relation to the optical axis of the optical system.

9. The exposure apparatus according to claim 8, further comprising
a fluid recovery port which is disposed radially outward of the fluid supply port in a radial direction in relation to the optical axis of the optical system.

10. The exposure apparatus according to claim 9, wherein the outer member has the fluid recovery port.

11. The exposure apparatus according to claim 1, wherein the terminating optical element has an emission surface and an outer surface extending upwardly with respect to the emission surface, and the liquid supply port faces the outer surface.

12. The exposure apparatus according to claim 1, wherein the gas space is disposed such that at least some of the carbon dioxide gas in the gas space is able to contact the liquid.

13. The exposure apparatus according to claim 1, wherein the carbon dioxide gas is capable of decreasing the specific resistance of the liquid.

14. The exposure apparatus according to claim 1, wherein the carbon dioxide gas supplied to the gas space is mixed with at least one additional gas.

15. A device manufacturing method comprising:
exposing a substrate using the exposure apparatus according to claim 1; and
developing the exposed substrate.

16. A method of exposing a substrate with exposure light, the method comprising:
supplying a liquid to an optical path of the exposure light with a liquid supply port of a liquid immersion member having an opening through which exposure light is projected;
removing at least some of the liquid in the optical path with a liquid recovery port of the liquid immersion member; and
supplying carbon dioxide gas to a gas space with a fluid supply port of the liquid immersion member, the gas space at least partially surrounding the optical path, the gas space being formed between the liquid immersion member on one side and an upper surface of the substrate and/or an upper surface of a substrate stage on the other side having a holder by which the substrate is held, which is movable relative to and below the optical system, the carbon dioxide gas being supplied from the fluid supply port in gas phase without liquid, wherein:
the liquid recovery port is disposed such that the upper surface of the substrate faces the liquid recovery port, and
the fluid supply port is disposed radially outward of the liquid recovery port in a radial direction in relation to an optical axis.

17. The method according to claim 16, wherein the liquid recovery port sucks the liquid in order to remove the liquid from the optical path.

18. The method according to claim 16, further comprising removing at least some of the carbon dioxide gas from the gas space with a fluid recovery port.

19. The method according to claim 18, wherein the fluid recovery port is disposed radially outward of the fluid supply port in a radial direction in relation to the optical axis.

20. The method according to claim 19, wherein the fluid supply port is disposed between the liquid recovery port and the fluid recovery port in a radial direction in relation to the optical axis to recover the carbon dioxide gas.

21. The method according to claim 18, wherein:
the gas space is substantially filled with gas, and
the fluid supply port and the fluid recovery port face the gas space.

22. The method according to claim 16, wherein at least some of the carbon dioxide gas contacts the liquid in the gas space and decreases the specific resistance of the liquid.

23. The method according to claim 16, wherein the carbon dioxide gas supplied to the gas space is mixed with at least one additional gas.

* * * * *